United States Patent [19]
Tsukude

[11] Patent Number: 5,812,490
[45] Date of Patent: Sep. 22, 1998

[54] SYNCHRONOUS DYNAMIC SEMICONDUCTOR MEMORY DEVICE CAPABLE OF RESTRICTING DELAY OF DATA OUTPUT TIMING

[75] Inventor: Masaki Tsukude, Hyogo, Japan

[73] Assignee: Mitsubishi Denki Kabushiki Kaisha, Tokyo, Japan

[21] Appl. No.: 912,200

[22] Filed: Aug. 18, 1997

[30] Foreign Application Priority Data

Feb. 27, 1997 [JP] Japan ...................................... 9-043888

[51] Int. Cl.⁶ ....................................................... G11C 8/00
[52] U.S. Cl. .............................. 365/233; 365/51; 365/63; 365/189.05; 365/230.03
[58] Field of Search ................................ 365/233, 51, 63, 365/189.05, 230.03

[56] References Cited

U.S. PATENT DOCUMENTS 5,604,710  2/1997  Tomishima et al. ................ 365/230.03
5,687,134  11/1997  Sugawara et al. ....................... 365/233

FOREIGN PATENT DOCUMENTS 2-194545  8/1990  Japan.
7-22511  1/1995  Japan.
8-102189  4/1996  Japan.

*Primary Examiner*—David C. Nelms
*Assistant Examiner*—Andrew Q. Tran
*Attorney, Agent, or Firm*—McDermott, Will & Emery

[57] ABSTRACT

An external clock signal ext.CLK applied to an external clock input pad is transferred to two internal clock generation circuits independent from each other through two independent input first stage circuits. An internal clock signal int.CLK1 controlling the operations of row related circuits and column related circuits is supplied by a first clock generation circuit and an internal clock signal int.CLK2 controlling an output buffer circuit is supplied from a second clock generation circuit.

18 Claims, 18 Drawing Sheets

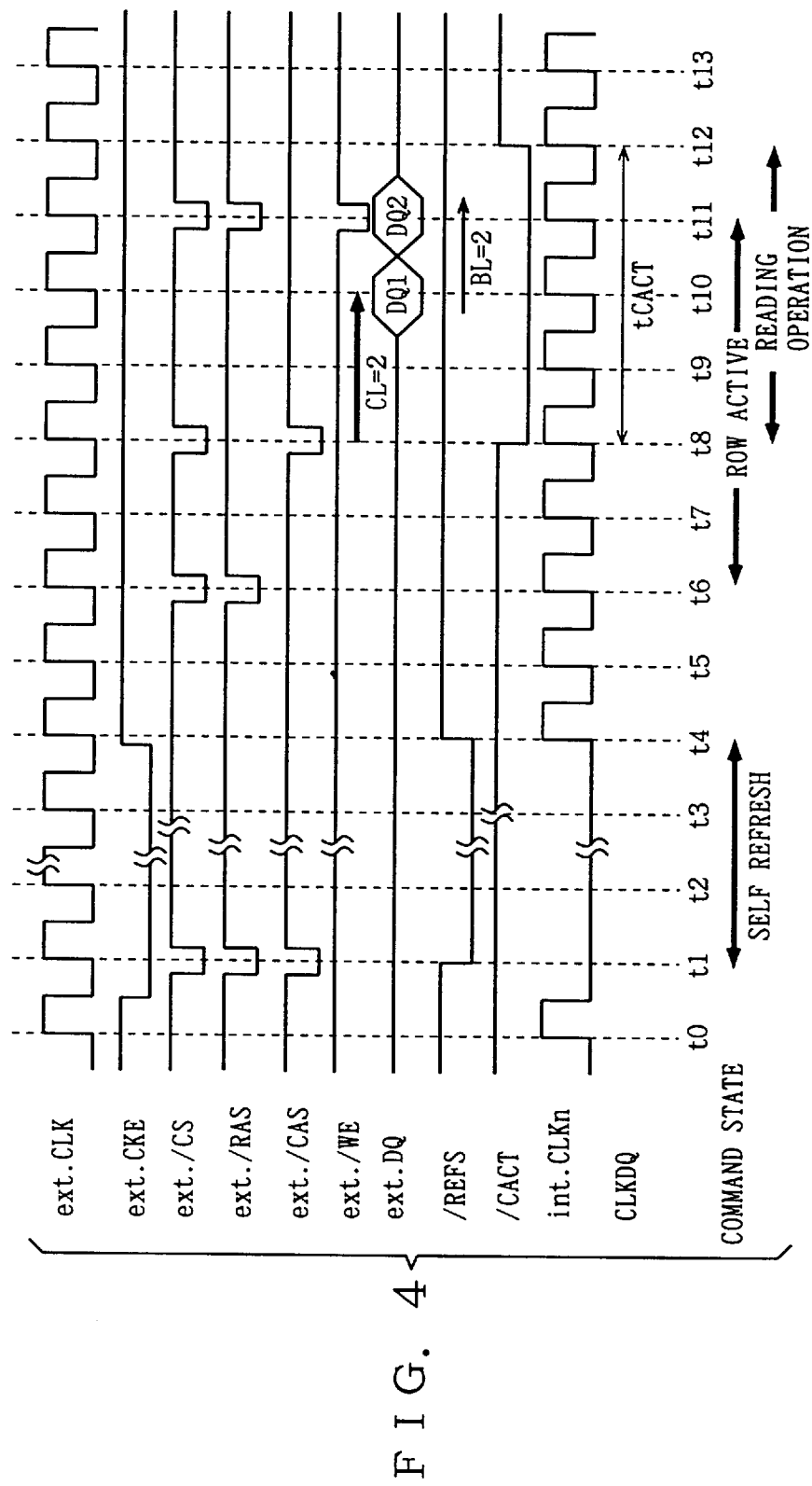
F I G. 4

PITCH = Line + Space
Line/Space = 1 ature of the present invention to provide a synchronous dynamic semiconductor memory device which will not be described.

SYNCHRONOUS DYNAMIC SEMICONDUCTOR MEMORY DEVICE CAPABLE OF RESTRICTING DELAY OF DATA OUTPUT TIMING

BACKGROUND OF THE INVENTION

1. Field of the Invention

The present invention relates generally to synchronous dynamic semiconductor memory devices operating in synchronization with an externally applied clock signal, and more particularly to the architecture of a synchronous dynamic semiconductor memory device controlling data reading operation in response to an externally applied clock signal.

2. Description of the Background Art

FIG. 17 is a diagram schematically showing the chip layout of a semiconductor memory device having a suitable arrangement of pads for a conventional LOC (Lead on Chip) structure. In FIG. 17, pads PD are arranged in alignment along a first direction (hereinafter simply as longer side direction) in a central region CR in a second direction (hereinafter simply as shorter side direction) of a semiconductor memory device chip 1. On both sides of central region CR of semiconductor chip 1, memory cell planes M#0 to M#3 including a memory cell array are arranged. Pads PD are connected by wire bonding in the vicinity of central region CR to a lead frame FR extending over semiconductor memory device chip 1 and up to the central part.

More specifically, in the LOC structure, the lead frame connected to the external terminals of the package is placed on an upper surface of the chip. Meanwhile, in the conventional structure in which the chip is placed on the lead frame, the bonding portions at the edge of the lead frame and the bonding pad portions in the periphery of the chip must be bonded by gold interconnections, which restricts the size of the chip to accommodate.

In the LOC structure, the lead frame is extended up to the central part of the chip over the chip, and bonding can be made therefrom, and therefore the positions of bonding pads on the chip can be shifted to the central part of the chip from the periphery of the chip as have been practiced. Therefore, the size of the chip to accommodate can be increased, or the self inductance and capacitance of package terminals can be reduced. In addition, since aluminum leads from the bonding pads of the chip to a buffer circuit can be shortened, the interconnection delay corresponding to the length can be reduced. Furthermore, as will be described later, the bonding pads and peripheral circuits can be placed crosswise in the center of the chip, so that the average interconnection length between circuit blocks within the peripheral circuit can be minimized, thus permitting to design high speed performance.

More specifically, as shown in FIG. 17, semiconductor memory device chip 1 has bonding pads and peripheral circuits placed in a crosswise area in the central part of the chip which corresponds to the unoccupied region after arranging memory cell planes M#0 to M#3. Such a configuration effectively reduces the interconnection delay in the peripheral circuits as will be described.

The following elements for example should be taken into account in arranging circuits and interconnection in order to reduce delay within the peripheral circuits: bonding pads and input/output pads should be placed close to each other, associated circuits should be concentrated/placed close to each other to localize the interconnection of a signal path determining the speed (critical path) as much as possible, signals not for the critical path should be directed to global interconnections if possible, and if a global interconnection become a critical path, the entire peripheral circuitry should be arranged so as to reduce the length as much as possible. In order to satisfy all these conditions as above in both row and column directions, the bonding pads and peripheral circuits are placed in the center of rows and in the center of columns, crosswise in the central part of the chip.

FIG. 18 is a diagram schematically showing the arrangement of pins in a package for a 256 MDRAM according to the JEDEC (Joint Electron Device Engineering Council) standard.

According to the standard corresponding to the pin arrangement shown in FIG. 18, pins for a clock signal, a control signal (such as ext./RAS and ext./CAS), an address signal and the like are arranged on the inner side of DQ pins for data input/output which are arranged on both ends of the package.

In this configuration, an external clock signal (ext.CLK) pin is located in the center of the package, in other words, is located at a position shifted from the center of the chip of the synchronous dynamic semiconductor memory device (pin No. 50 or 51).

Since the external clock signal input pin is thus located at a position shifted from the central part of the chip, signal skew is caused in the data output operation of the synchronous dynamic semiconductor memory device as will be described later, and the operation speed may be impeded from improving.

Now, the operation of a conventional synchronous dynamic semiconductor memory device will be described.

While the Dynamic Random Access Memory (hereinafter as DRAM) used as a main memory is generally capable of operating at a high speed, the operation speed is far below that of the microprocessor (hereinafter as MPU). The access time and cycle time for the DRAM has been a bottle neck in improving the performance of the entire system. In recent years, a synchronous DRAM (Synchronous Dynamic Random Access Memory: hereinafter referred to as "SDRAM") used as a main memory for a high speed MPU and operating in synchronization with a clock signal came to be used in a system.

In the SDRAM, there is a specification for accessing serial bits, for example 8 bits in series per a single data input/output terminal in synchronization with a system clock signal (externally applied clock signal). FIG. 19 shows a standard timing chart which satisfies the specification for such serial accessing. In FIG. 19, in an SDRAM in which 8 bit (1 byte) data can be input/output to/from data input/output terminals DQ0 to DQ7, 8 bits of data are serially read out. More specifically, 8 bits×8=64 bit can be serially written.

The number of bits of data which are serially read out or written is called burst length BL, which can be changed by a mode register in the SDRAM.

As shown in FIG. 19, the SDRAM receives externally applied control signals, in other words a row address strobe signal /RAS, a column address strobe signal /CAS, and an address signal Add at the rising edge of externally applied clock signal CLK.

Address signal Add includes time-divisionally multiplexed row address signal Xa and column address signal Yb.

At the rising edge of clock signal CLK in cycle 1, if external row address strobe signal ext./RAS is at an active "L" level and external column address strobe signal ext./ CAS and external write enable signal ext./WE are at an "H" level, address signal Add at the time is received as row address signal Xa.

Then, at the rising edge of clock signal CLK in cycle 4, if external column address strobe signal ext./CAS is at an active "L" level, address signal Add at the time is received as column address signal Yb. The operation of selecting a row and a column is performed within the SDRAM according to thus received row address signal Xa and column address signal Yb. After external row address strobe signal ext./RAS falls to an "L" level and a prescribed clock time period (6 clock cycles in FIG. 19) passes, the first data b0 of 8 bit data output from data input/output terminal DQ is output.

Thereafter, data b1 to b7 are output in response to the risings of clock signal CLK.

FIG. 20 is a timing chart showing the states of external signals when 8 bits of data are serially written for each data input/output terminal DQ in the SDRAM.

In a writing operation, row address signal Xa is received similarly as the case of reading out data. In other words, at the rising edge of clock signal CLK in cycle 1, if signal ext./RAS is at an active "L" level, and signals ext./CAS and ext./WE are at an "H" level, address signal Add at the time is received as row address signal Xa.

At the rising edge of clock signal CLK in cycle 4, if signals ext./CAS and ext./WE are both at an active "L" level, column address signal Yb is received, while data b0 applied to data input/output terminal DQ at the time is received as the first write data of the 8 bits of data to be serially written.

In response to the rising edge of signals ext./RAS and ext./CAS, the operation of selecting a row and a column is performed within the SDRAM. Thereafter, in synchronization with clock signal CLK, input data b1 to b7 are sequentially received, and are sequentially written into corresponding memory cells.

As described above, in the SDRAM, unlike the method of operation in the conventional DRAM by receiving address signals and input data in synchronization with externally applied control signals such as row address strobe signal ext./RAS and column address strobe signal ext./CAS, external signals such as address strobe signals ext./RAS, ext./CAS, address signals and input data are received at the rising edge of clock signal CLK which is a system clock signal externally applied.

Thus, the SDRAM performs a synchronizing operation to received a control signal and a data signal in synchronization with an externally applied clock signal, it is not necessary to secure a margin for data input/output time due to the skew of an address signal (timing shift). Therefore, the cycle time can be advantageously reduced. Thus, serial data can be written and read out in synchronization with a clock signal, and therefore the time required for accessing when serial addresses are sequentially accessed can be reduced.

FIG. 21 is a block diagram schematically showing a part of the configuration of a conventional SDRAM 4000.

In FIG. 21, among the plurality of pads PD shown in FIG. 17, only two data input/output terminals DQ present in the vicinity of the shorter sides of the chip and only three input/output terminals out of the external clock input terminals to which external clock signal ext.CLK is input are shown, and the other input terminals including the address signal input terminal are not shown.

The conventional SDRAM 4000 includes a memory cell array divided into four memory cell planes M#0 to M#3, a row decoder 106 provided for each memory cell plane and selecting a corresponding row in response to an externally applied row address signal Xa, a column decoder 108 provided for each memory cell plane and selecting a corresponding column in response to an externally applied column address signal Yb, a control circuit 100 controlling the reading and writing operations of internal circuitry in response to externally applied control signals, a chip select signal ext./CS, clock enable signal ext.CKE, row address strobe signal ext./RAS column address strobe signal ext./ CAS, and write enable signal ext./WE, an input first stage buffer circuit 104 to receive external clock signal ext./CLK applied through an external clock input pad 112, a clock generation circuit 102 which receives the output of first stage input buffer circuit 104 through a interconnection 116 and generates an internal clock signal, an output buffer 118 which receives read data read out from an externally selected memory cell and output through an input/output circuit 110 and outputs the read data in synchronization with the internal clock signal from clock generation circuit 102, and a data input/output pad 114 which receives the output of output buffer 118 and outputs the read data.

It is noted that data input/output pads on the left side of the chip are referred to as DQL while data input/output pads on the right side of the chip are referred to as DQR for the ease of illustration.

Among the control signals as described above, signal ext./CKE specifies a self refresh mode in its active state ("L" level), signal ext./CS specifies reading of a control signal during in its active state ("L" level), ext./RAS specifies the activation of the operation of row related circuitry in its active state ("L" level), signal ext./CAS specifies the operation of column related circuitry in its active state ("L" level), and signal ext./WE specifies the start of a data write mode when it is activated.

Note however that only the basic functions of these control signals are described above, and these signals in a special combination will specify the start or end of a certain operation mode to control circuit 100 as will be described.

Generally, an input first stage buffer circuit is provided in the vicinity of a pad for inputting/outputting a signal, the output of the circuit is input to a group of master control circuits present in the vicinity of the center of the chip, and the master control circuit group generates a signal to control the entire chip. Such a configuration is generally employed for internal clock generation circuit 102, and input first stage buffer circuit 104 in the vicinity of external clock input pad 112 changes the level of an externally applied clock signal from the external level (for example, 5 V in full swing) to a chip internal level (for example, 3.3 V in full swing), then transfers the external clock signal to clock generation circuit 102 within the master control circuit group.

Clock generation circuit 102 adjusts the pulse width of a clock signal and supplies an internal clock signal for each purpose of use into the chip. The circuitry on the side receiving the supplied internal clock signal is roughly divided into row related circuits, column related circuits, and data output related circuits.

More specifically, in the external clock synchronous memory such as SDRAM, the row selecting operation, column selecting operation, data reading operation, data output operation and the like are performed in synchronization with an external clock signal, and it is closely related to the chip performance how short could be the time delay for the internal clock signal supplied to the data output related circuits to reach data output buffer circuit 118 corresponding to data output pad 114.

In other words, how to speed up the supply of the internal clock signal to the data output buffer is critical in improving the performance of the chip including the access time.

As shown in FIG. 21, in the conventional SDRAM 4000, the external clock signal is once transferred from external clock signal input pad 112 to the vicinity of the center of the chip, then clock generation circuit 102 simultaneously generates internal clock signals to be supplied to the data output buffer and other row related or column related circuits.

Therefore, in order to transfer the internal clock signal to the data output buffer faster, the current driving capability of the transistor forming input first stage buffer circuit 104 should be increased. Stated differently, the size of the transistor (gate width) forming input first stage buffer circuit 104 should be increased.

Input first stage buffer circuit 104 is however used for other internal clock signals, and therefore always consumes large current during the operation of SDRAM 4000.

FIG. 22 is a block diagram schematically showing external clock signal input pad 112, input first stage buffer circuit 104 and clock generation circuit 102.

If pads are arranged within a chip corresponding to the pin arrangement standard shown in FIG. 18, the length l of interconnection 116 between input first stage buffer circuit 104 in the vicinity of external clock signal input pad 112 and clock generation circuit 102 provided in the center of the chip could be as long as 1 to 2 mm.

Therefore, first stage input buffer circuit 104 must have current driving capability enough to drive the relatively long interconnection 116.

FIG. 23 is a block diagram schematically showing the configuration of first stage input buffer circuit 104 and internal clock generation circuit 102.

As shown in FIG. 23, first stage input buffer circuit 104 includes a differential amplifying circuit 1042 and a driver circuit 1044.

Differential amplifying circuit 1042 receives a reference potential Vref at its one input end, and receives the potential level of an external clock signal from external clock input pad 112 at its another input end. Differential amplifying circuit 1042 is controlled by a power down mode enable signal /PDE which attains an active state ("L" level) when the power supply is off.

Differential amplifying circuit 1042 operates only if the supply of power to SDRAM 4000 is started and power down mode enable signal /PDE attains an inactive state ("H" level).

When receiving the output of differential amplifying circuit 1042, driver circuit 1044 must drive at the same time the potential level of interconnection 116, a driver circuit 1022 which supplies an internal clock signal to the data output buffer corresponding to pad DQL in clock generation circuit 102, a driver circuit 1024 which supplies an internal clock signal to the data output buffer corresponding to pad DQR and a driver circuit 1026 which supplies an internal clock signal to other row related or column related circuits.

More specifically, the size of the transistor forming input first stage buffer circuit 104 must be large enough to commonly transfer an external clock signal to all the circuits which generate internal clock signals to the data output buffer and other internal circuits. Input first stage buffer 104 of a differential amplifier type configuration as shown in FIG. 23 across which through current is constantly passed consumes large current even in a stand-by state, and the stand-by current of SDRAM 4000 becomes large.

SUMMARY OF THE INVENTION

It is an object of the invention to provide a synchronous dynamic semiconductor memory device capable of transmitting an internal clock signal to regulate data output timing to a data output buffer at a high speed.

Another object of the invention is to provide a synchronous dynamic semiconductor memory device capable of reducing current consumption in its stand-by state.

In summary, a rectangular synchronous dynamic semiconductor memory device which receives a plurality of external signals including a control signal and an address signal in synchronization with an externally applied clock signal of a series of pulse trains, and outputs memory data. The device includes a memory cell array, a first clock generation circuit, a control circuit, a plurality of input/output terminals, a row selecting circuit, a column selecting circuit, a second clock generation circuit, and first and second data output circuits.

The memory cell array has a plurality of memory cells arranged in rows and columns. The first clock generation circuit receives an externally applied clock signal and outputs an internal clock signal. The control circuit controls the data output operation of the synchronous dynamic semiconductor memory device in response to an internal clock signal and an external signal. The plurality of input/output terminals receive a plurality of externally applied signals, or output memory data, and are provided along a first side direction of the rectangle. The plurality of input/output terminals include an external clock input terminal to receive the external clock signal, and first and second data input/output terminals provided with the external clock input terminal and the control circuit therebetween. The row selecting circuit is controlled by the control circuit and selects a corresponding row in the memory cell array in synchronization with an internal clock signal from the first clock generation circuit and in response to an externally applied row address signal. The column selecting circuit is controlled by the control circuit and selects a plurality of corresponding columns in the memory cell array in synchronization with an internal clock signal from the first clock generation circuit and in response to a column address signal, and reads out the memory data of a plurality of memory cells corresponding to the selected row and columns. The second clock generation circuit receives an external clock signal from the external clock input terminal and outputs an internal clock signal. The first and second data output circuits receive corresponding memory data from the column selecting circuit and output the memory data to first and second data input/output terminals in synchronization with the internal clock signal directly received from the second clock generation circuit.

The synchronous dynamic semiconductor memory device preferably further includes a first clock input buffer circuit provided corresponding to the external clock input terminal to buffer the external clock signal for transfer to the first clock generation circuit, and a second clock input buffer circuit provided corresponding to the external clock input terminal to buffer the external clock signal for transfer to the second clock generation circuit and having current driving capability larger than the first clock input buffer circuit.

In another preferable embodiment, the device further includes a first clock input buffer circuit provided corresponding to the external clock input terminal to buffer the external clock signal for transfer to the first clock generation circuit, and a second clock input buffer circuit provided within a shorter distance from the second clock generation circuit as compared to the distance between the control circuit and the second clock generation circuit to buffer the external clock signal applied to the external clock input terminal for transfer to the second clock generation circuit.

In yet another preferred embodiment, the control circuit activates the second clock input buffer circuit during the period in which a data read mode is specified in response to an externally applied signal.

In another aspect of the invention, a rectangular synchronous dynamic semiconductor memory device which receives a plurality of externally applied signals including a control signal and an address signal in synchronization with an external clock signal formed of a series of pulse strings and outputs storage data includes an even number of memory cell planes.

The memory cell planes are provided so as to leave a rectangular margin region having a prescribed width along at least one of the central axis in the longer side direction and the central axis in the shorter side direction and each include a plurality of memory cells arranged in rows and columns.

In the margin region, there are provided a first clock generation circuit, a control circuit, a plurality of input/output terminals, a row selecting circuit, a column selecting circuit, a second clock generation circuit, and first and second data output circuits.

The first clock generation circuit receives an externally applied clock signal and outputs an internal clock signal. The control circuit controls the data output operation of the synchronous dynamic semiconductor memory device in response to the internal clock signal and an external signal. The plurality of input/output terminals receive a plurality of external signals or output storage data, and are provided along the direction of the central axis of the margin region. The plurality of input/output terminals have an external clock input terminal to receive an externally applied clock signal, and first and second data input/output terminals provided with the external clock input terminal and the control circuit being therebetween. The row selecting circuit is controlled by the control circuit to select a corresponding row in a memory cell plane in synchronization with the internal clock signal from the first clock generation circuit and in response to an externally applied row address signal. The column selecting circuit is controlled by the control circuit to select a plurality of corresponding columns in the memory cell plane in synchronization with the internal clock signal from the first clock generation circuit and in response to a column address signal and read the storage data of a plurality of memory cells corresponding to the selected row and columns. The second clock generation circuit receives an externally applied clock signal from the external clock input/output terminal and outputs an internal clock signal. The first and second data output circuits receive corresponding storage data from the column selecting circuit and output the storage data to the first and second data input terminals correspondingly in synchronization with the internal clock signal directly received from the second clock generation circuit.

According to the present invention, since the clock generation circuit to generate an internal clock signal to drive the output buffer circuit is independently provided, if the internal clock signal is transferred through the critical path to the output buffer circuit during data reading operation, the operation speed can be advantageously improved.

Another advantage of the invention resides in that if the clock signal is transferred to the output buffer through the critical path which determines the operation speed, designing flexibility to increase the operation speed improves.

Yet another advantage of the invention resides in that since the second clock input buffer circuit attains an active state in a data reading operation mode, the increase of current consumption in a stand-by state can be restricted.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a timing chart for use in illustration of the operation of SDRAM 1000.

DESCRIPTION OF THE PREFERRED EMBODIMENTS

First Embodiment

Figure 1:
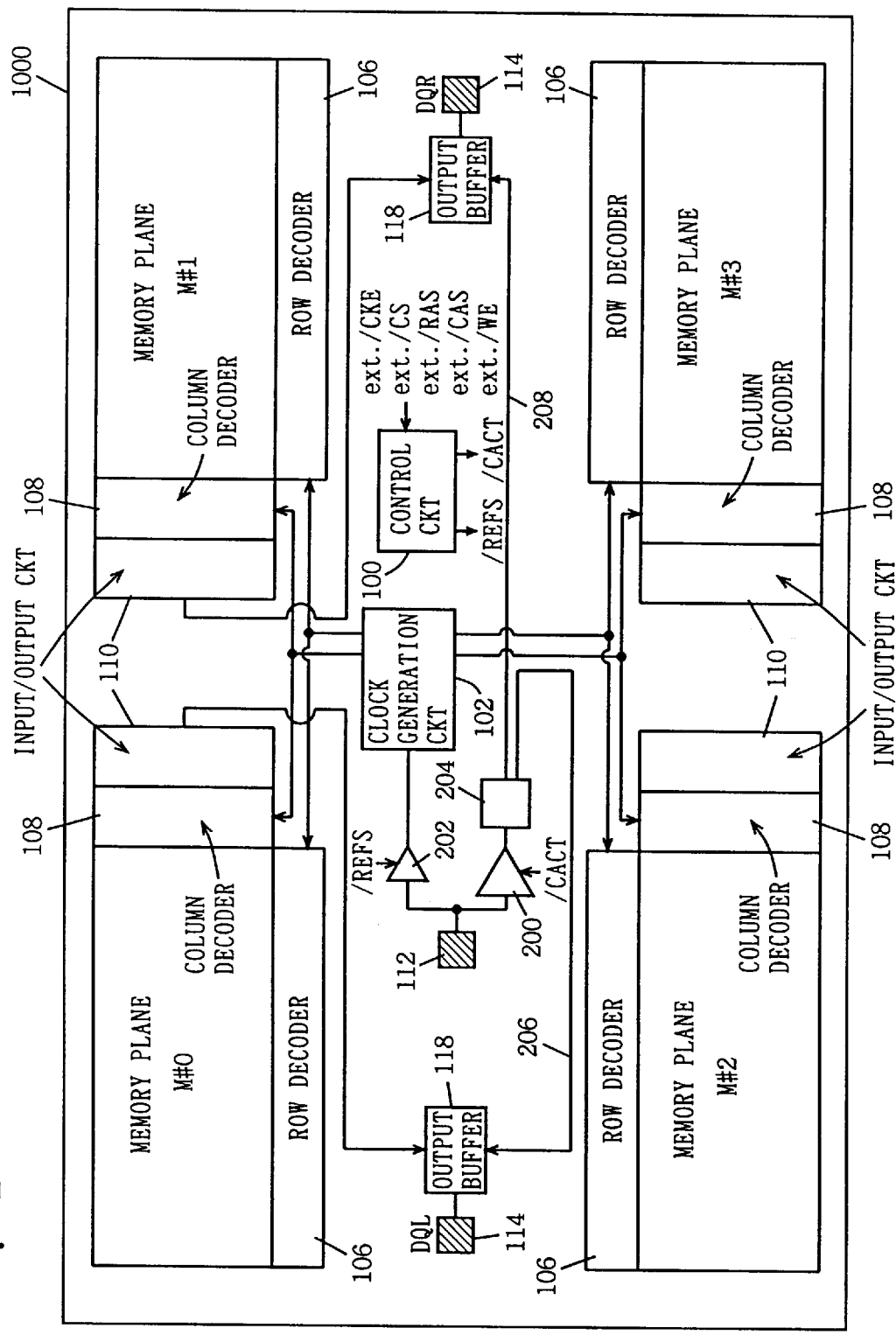
FIG. 1 is a block diagram schematically showing the configuration of an SDRAM 1000 according to a first embodiment of the invention.

FIG. 1 is a block diagram showing the configuration of a synchronous semiconductor memory device according to a first embodiment of the invention, an SDRM 1000.

SDRAM 1000 includes a memory cell array divided into four memory cell planes M#0 to M#3. Memory cell planes M#0 to M#3 are arranged to leave a prescribed margin region in the central part of the chip so that pads and peripheral circuits both can be provided crosswise in the central part of the chip.

SDRAM 1000 further includes a row decoder 106 provided corresponding to each of memory cell planes M#0 to M#3 to select a row in a corresponding memory plane in response to an externally applied row address signal Xa, a column decoder 108 provided corresponding to each of memory planes M#0 to M#3 to select a column in a corresponding memory plane in response to an internal column address signal Yb, an input/output circuit 110 corresponding to each of memory planes to read out data from a selected memory cell during a reading operation, and write data to a selected memory cell during a writing operation, a control circuit 100 which controls the operation of each internal circuit in response to externally applied control signals ext.CKE, ext./CS, ext./RAS, ext./CAS and ext./WE and outputs for example an active self refresh mode specifying signal /REFS in a self refresh mode to bring a signal /CACT to control data output operation into an active state ("L" level), an external clock input pad 112 supplied with an external clock signal ext.CLK, an input first stage buffer circuit 202 which receives external clock signal ext.CLK from the external clock input pad and buffers the signal for output, a first clock generation circuit 102 which receives the output of input first stage buffer circuit 202 and outputs a first internal clock signal int.CLK1, a second input first stage buffer circuit 200 which receives the external clock signal from external clock input pad 112 and buffers the signal for output, a second clock generation circuit 204 which receives the output of second input first stage buffer 200 and outputs a second internal clock signal int.CLK 2 to control the data output operation, an output buffer circuit 118 which receives data read out from memory plane M#0 and is controlled by second internal clock signal CLK2 to drive data input/output pad 114, a interconnection 206 connecting the second clock generation circuit and output buffer 118 corresponding to a data input/output pad DQL present on the left of the chip, and a interconnection 208 connecting output buffer circuit 118 corresponding to data input/output pad DQR present on the right of the chip and second clock generation circuit 204.

Note that in FIG. 1, four memory cell planes M#0 to M#3 are provided to leave a prescribed margin region so that pads and peripheral circuits both can be provided crosswise in the center of the chip, but as will be described later, the present invention is not limited to such a configuration and is also applicable to a more general number and a more general arrangement of memory cell planes. For example, two memory cell planes may be provided to leave a prescribed margin region so that pads and peripheral circuits both can be provided linearly through the center of the chip.

Herein, internal clock signal int.CLK1 output from first clock generation circuit 102 is used to control the operations of the row related circuits of SDRAM 1000 such as row decoder 106, the column related circuits such as column decoder 108 and input/output circuit 110. In operation, first input first stage circuit 202 attains an inactive state during the period in which signal /REFS is in an active state ("L" level).

Meanwhile, the operation of second input first stage buffer circuit 200 is controlled by signal./CACT as will be described later and attains an active state only during the reading operation.

Note that the activation or inactivation of signal /REFS and signal /CACT is defined by a combination of externally applied control signals applied to control circuit 100 as will be described.

Figure 21:
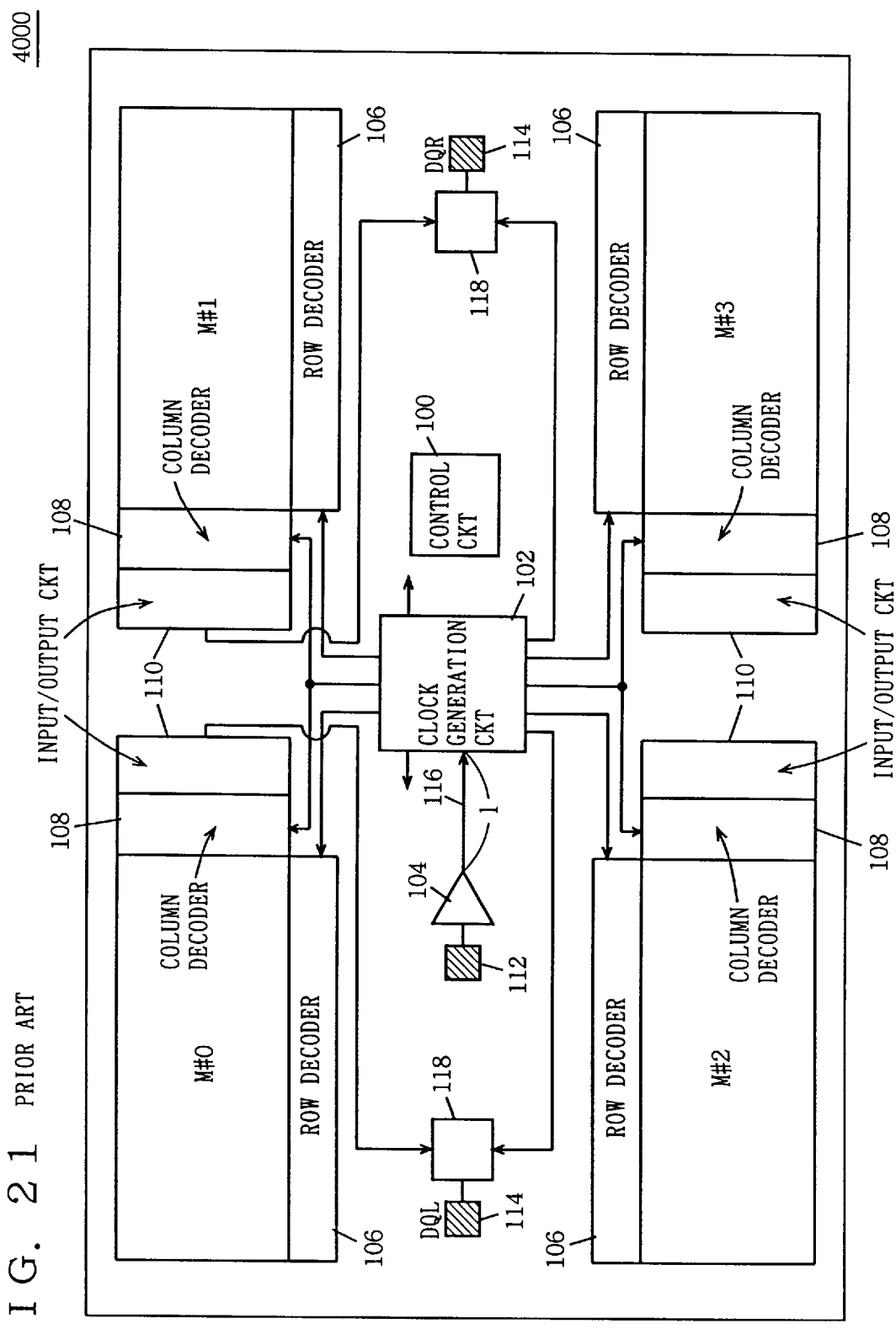
FIG. 21 is a block diagram schematically showing the configuration of a conventional SDRAM 4000.
Figure 22:
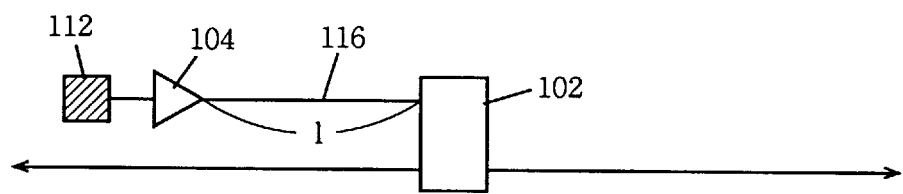
FIG. 22 is a block diagram schematically showing the portion of the conventional SDRAM 4000 which generates an internal clock signal.

The configuration of SDRAM 1000 in FIG. 1 is equivalent to the configuration of the conventional SDRAM 4000 in FIG. 21 except for the following differences.

First, the input first stage buffer circuit connected to external clock input pad 112 supplied with external clock signal ext.CLK is divided into two circuits, in other words divided into first input first stage buffer circuit 202 and second input first stage buffer circuit 200, and first input first stage buffer circuit 202 transfers an external clock signal to first clock generation circuit 102 which generates internal clock signals to control the row related or column related circuits and other internal circuits as described above. Meanwhile, second input first stage buffer circuit 200 transfers external clock signal ext.CLK to second clock generation circuit 204 which outputs the internal clock signal to control the operation of output buffer circuit 118.

Secondly, second input first stage buffer circuit 200 has current driving capability larger than first input first stage buffer circuit 202. More specifically, the size of the transistor forming second input first stage buffer circuit 200 is larger than the size of the transistor forming first input first stage buffer circuit 202.

Thirdly, first input first stage buffer circuit 202 is controlled by signal /REFS and active other than during the refresh period, and second input first stage buffer circuit 200 is controlled by signal /CACT and active only during the reading operation.

Fourthly, interconnection 206 transferring a signal output from second clock generation circuit 204 to output buffer 118 corresponding to pad DQL extends up to the central part of the chip, then folded to reach output buffer 118.

Figure 2:
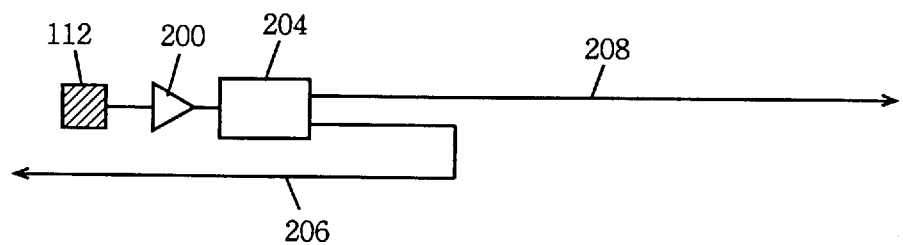
FIG. 2 is a block diagram showing an essential portion for generating an internal clock signal in SDRAM 1000.

FIG. 2 shows the part of interconnections 206 and 208 transferring internal clock signals to external clock input pad 112, second input first stage buffer circuit 200, second clock generation circuit 204, and output buffer 118 in the configuration of SDRAM 1000 shown in FIG. 1.

As described above, interconnection 206 first extends in the same direction as interconnection 208 from the second clock generation circuit 204, and then folded to extend in the opposite direction to interconnection 208.

Figure 3:
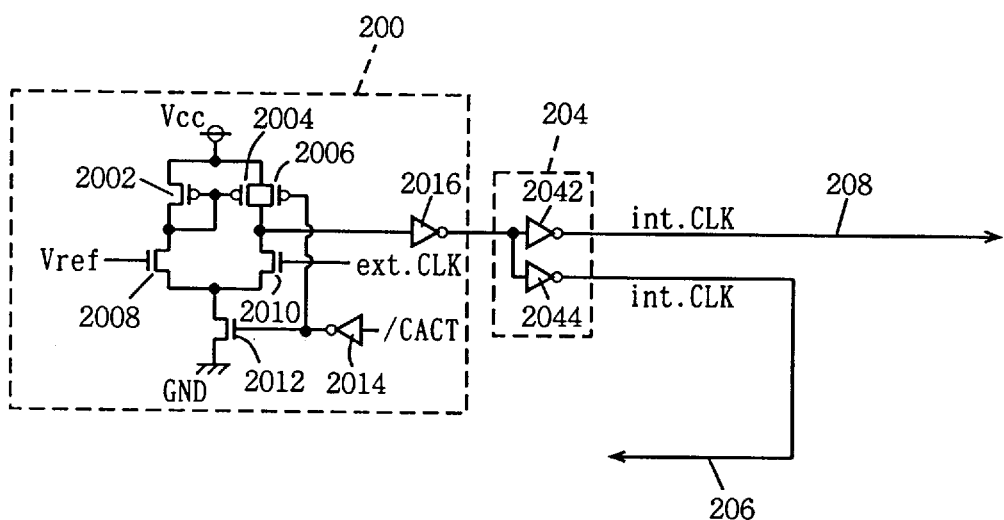
FIG. 3 is a block diagram showing in more detail the configuration of the portion for generating an internal clock signal shown in FIG. 2.

FIG. 3 is a block diagram showing more in detail the configuration of second input first stage buffer circuit 200 and second clock generation circuit 204 in FIG. 2.

Second input first stage buffer circuit 200 includes a pair of p channel MOS transistors 2002 and 2004 both receiving power supply potential Vcc at their sources and constituting a current mirror circuit, an n channel MOS transistor 2008 having a drain connected to the drain of p channel MOS transistor 2002 and receiving a reference potential Vref at its gate, an n channel MOS transistor 2010 having a drain connected to the drain of p channel MOS transistor 2004 and receiving external clock signal ext.CLK at its gate, an n channel MOS transistor 2012 having a source connected to ground potential GND, a drain in common connected to the sources of n channel MOS transistors 2008 and 2010, and receiving the inverse of signal /CACT produced by inverter 2014 at its gate, a p channel MOS transistor 2006 receiving the output of inverter 2014 at its gate, and connected in parallel with p channel MOS transistor 2004, and a driver circuit 2016 receiving the potential of the connection point of p channel MOS transistor 2004 and n channel MOS transistor 2010 and inverting the potential for external output.

Meanwhile, second clock generation circuit 204 includes an inverter 2042 which receives the output of driver circuit 2016 and operates as a driver circuit to output an internal clock signal to interconnection 208, and an inverter 2044 which receives the output of driver circuit 2016 and operates as a driver circuit to output internal clock signal int.CLK to interconnection 206.

Note that the configuration of first input first stage buffer circuit 202 is substantially identical to that of second input first stage buffer circuit 200 except that the control signal used is signal /REFS.

Figure 23:
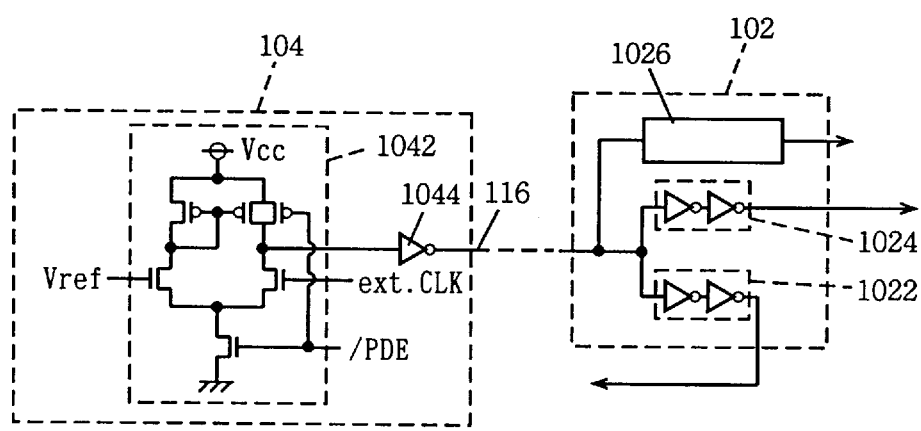
FIG. 23 is a circuit diagram showing more in detail the schematic block diagram in FIG. 22.

The configuration of second input first stage buffer circuit and second clock generation circuit according to the first embodiment of the invention shown in FIG. 3 has the following advantages over the configuration of the conventional input first stage buffer circuit and clock generation circuit shown in FIG. 23.

More specifically, firstly, second input first stage buffer circuit 200 is controlled by signal /CACT and active only during the period in which signal /CACT is active, in other words during the period in which the read operation mode is specified, and therefore the operation current of SDRAM 1000 in the stand-by state will not be increased if the size of the transistors forming second input first stage buffer circuit 200 is increased.

More specifically, the first input first stage buffer circuit and the second input first stage buffer circuit are provided independently from each other, and if second input first stage buffer circuit 200 is designed to have enough current driving capability as the critical path for the data output operation, the operation current of SDRAM 1000 in the stand-by state will not increase, because the second input first stage buffer circuit operates only during the reading operation.

Furthermore, second clock generation circuit 204 is provided in a close vicinity of second input first stage buffer circuit 200, and therefore driver circuit 2016 does not have to drive large interconnection capacitance, and needs only drive inverters 2042 and 2044 to drive interconnections 206 and 208. Designing related to the current driving capability of driver circuit 2016 may be more flexible.

As described above, interconnection 206 extends in the same direction as interconnection 206 up to the vicinity of the center of the chip, then runs in the opposite direction to interconnection 208, and is connected to output buffer circuit 118, and therefore the time difference for internal clock signal int.CLK2 output from second clock generation circuit 204 to reach output buffer circuits 118 present on both ends of the chip can be restricted.

Therefore, the skew of output data caused at the time of outputting data can be reduced, and the operation is enabled according to faster cycle time.

FIG. 4 is a timing chart for use in illustration of the operation of SDRAM 1000 in FIG. 1.

During the period from time t0 to time t1, signal ext.CKE changes its state to an active state ("L" level).

At the rising edge of external clock signal ext.CLK at time t1, as signals ext.CKE, ext./CS, ext./RAS and ext./CAS are all at an active state ("L" level), and signal ext./WE is at an inactive state ("H" level), control circuit 100 detects that the self refresh mode has been specified and brings signal /REFS to an active state ("L" level) accordingly.

At the time, as described in conjunction with FIG. 1, first input first stage buffer circuit 202 attains an inactive state in response to the active state of signal /REFS.

Meanwhile, since signal /CACT is at an inactive state ("H" level), second input first stage buffer circuit 200 is also in an inactive state.

In the self refresh mode, in response to an internal address signal output from control circuit 100, each row in memory planes M#0 to M#3 is sequentially selected to rewrite data, in other words to perform a refresh operation.

During the period from time t3 to time t4, signal ext. CKE changes its state to an inactive state ("H" level).

Thus, at the rising edge of external clock signal ext.CLK at time t4, as control signals ext.CKE, ext./CS, ext./RAS, ext./CAS and ext./WE are at an inactive state ("H" level), control circuit 100 detects that the end of the self refresh mode has been specified and completes the self refresh operation accordingly.

At the rising edge of external clock signal ext.CLK at time t6, as signals ext./CS and ext./RAS are both at an active state ("L" level), while signals ext.CKE, ext./CAS and ext./WE are at an inactive state ("H" level), control circuit 100 makes such a control to incorporate a signal applied on the external address input terminal (pad) at the point as a row address signal accordingly.

At the point, signal /REFS is at an inactive state ("H" level), and first input first stage buffer circuit 202 is operating, in response to which first clock generation circuit 102 operates and supplies internal clock signal int.CLK1 to a corresponding internal circuit.

At the rising edge of external clock signal ext.CLK at time t8, control signals ext./CS and ext./CAS are both in an active state, while signals ext.CKE, ext./RAS, and ext./WE are all in an inactive state, in response to which control circuit 100 make such a control to incorporate a signal applied on the address signal input terminal (pad) at the time as a column address signal.

In FIG. 4, the CAS latency, in other words the number of cycles CL since the cycle in which the column address signal is incorporated until the start of data output is specified as 2. Note that this specification is made by a combination of a control signal and an address signal for example in the set cycle of reading operation (not shown).

In response to signals ext./CS and ext./CAS both being in an active state, control circuit 100 changes the state of signal /CACT to an active state ("L" level). Second input first stage buffer circuit 200 changes its state into an active state accordingly as described in FIG. 3.

Therefore, second clock generation circuit 204 starts supplying second internal clock signal int.CLK2 to output buffer circuit 118.

The operation of outputting data read out from a selected memory cell is initiated at time t10 two cycles after time t8.

In this embodiment, the number of pieces of data output per one data input/output terminal (pad) in a single reading operation, in other words burst length BL is specified as 2.

Note that the burst length is also specified by a combination of control signals and address signals in the set cycle for the reading operation mode (not shown).

At time t10, the first bit of read data is output, and then the second bit of data is output at time t11. At time t11, control signals ext./CS, ext./RAS and ext./WE are all in an active state, while signals ext.CKE and ext./CAS are all in an inactive state, in response to which the end of the reading operation is specified, and control circuit 100 changes the state of signal /CACT to an inactive state ("H" level) at time t12 accordingly.

As described above, in SDRAM 1000 according to the first embodiment, during the refresh operation period, first and second input first stage buffer circuits 202 and 200 are both in an inactive state, current consumption due to through current by the differential amplifier can be restricted from increasing.

In addition, if the size of the transistors constituting the second input first stage buffer circuit 200 is increased in order to increase the current driving capability of the circuit, the circuit is activated only during the period of reading operation mode, and therefore current consumption in the stand-by state will not increase.

Figure 5:
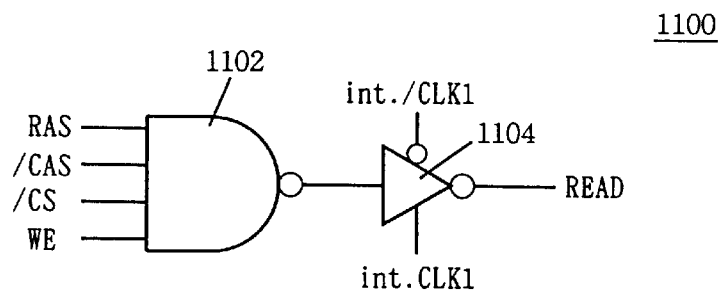
FIG. 5 is a block diagram schematically showing the configuration of a first circuit portion 1100 included in control circuit 100.

FIG. 5 is a diagram showing a circuit portion 1100 included in control circuit 100 to activate signal CACT only during the reading operation period as shown in FIG. 4.

Figure 6:
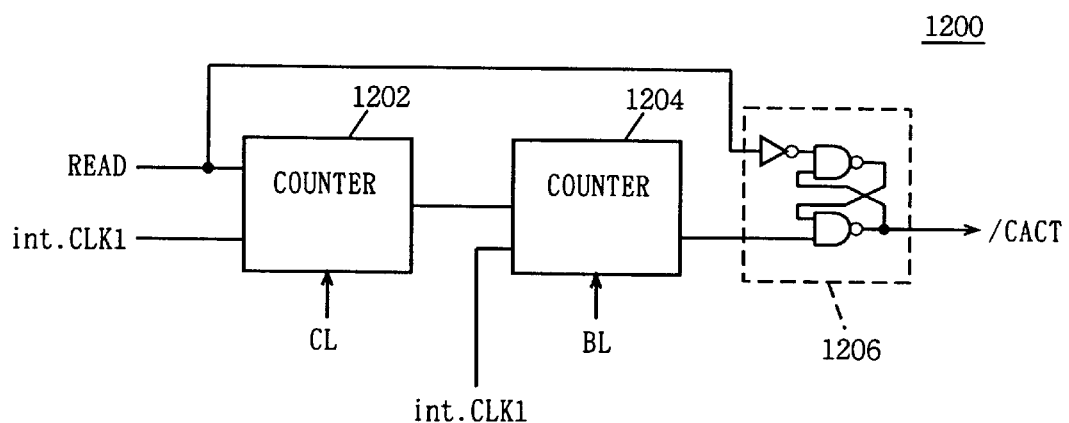
FIG. 6 is a block diagram schematically showing the configuration of a second circuit portion 1200 included in control circuit 100.

FIG. 6 is a block diagram schematically showing the configuration of a circuit portion 1200 included in control circuit 100 which receives the output from the circuit shown in FIG. 5 and activates signal /CACT only during the period corresponding to a prescribed number of cycles.

Referring to FIG. 5, circuit 1100 includes a 4-input NAND circuit 1002 receiving a signal RAS which is the inverse of signal ext./RAS, signal ext./CAS, signal ext./CS and signal WE which is the inverse of signal ext./WE, and a clocked inverter circuit 1104 receiving the output of NAND circuit 1002 and controlled by internal clock signal int.CLK1 and its inverse int./CLK1 to output a signal READ.

Referring to FIG. 6, circuit 1200 includes a counter 1202 which receives CAS latency CL and internal clock signal int.CLK1, starts counting in response to the activation of signal READ, and activates the level of the output signal in response to the coincidence of the counted number of cycles of external clock signal int.CLK1 with CAS latency CL, a counter 1204 which starts counting in response to the activation of the signal level of the output of counter 1202, counts the number of cycles of internal clock signal int.CLK1, and activates the output signal level at the point at which the counted number coincides with burst length BL, and a latch circuit 1206 which activates signal /CACT in response to the activation of signal READ, and inactivates signal /CACT in response to the activation of the output signal of counter 1204.

The configurations of circuits 1100 and 1200 shown in FIGS. 5 and 6 permit signal /CACT as shown in FIG. 4 to be generated.

Second Embodiment

In SDRAM 1000 in the first embodiment, second input first stage buffer circuit 200 is activated only in the reading operation mode.

In an SDRAM according to a second embodiment, second input first stage buffer circuit 200 is activated when SDRAM 1000 is in an active state, in other words during the period after the activation of the operation of the row related circuits followed by the end of the reading operation until the precharge operation of the row related circuits is initiated.

The other features are substantially identical to those of SDRAM 1000, the description will not be repeated.

Figure 7:
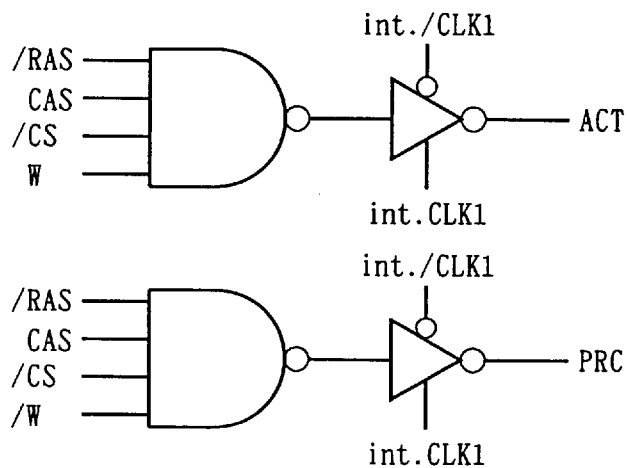
FIG. 7 is a block diagram schematically showing the configuration of a first circuit portion 1300 included in a control circuit 100 in an SDRAM according to a second embodiment of the invention.
Figure 8:
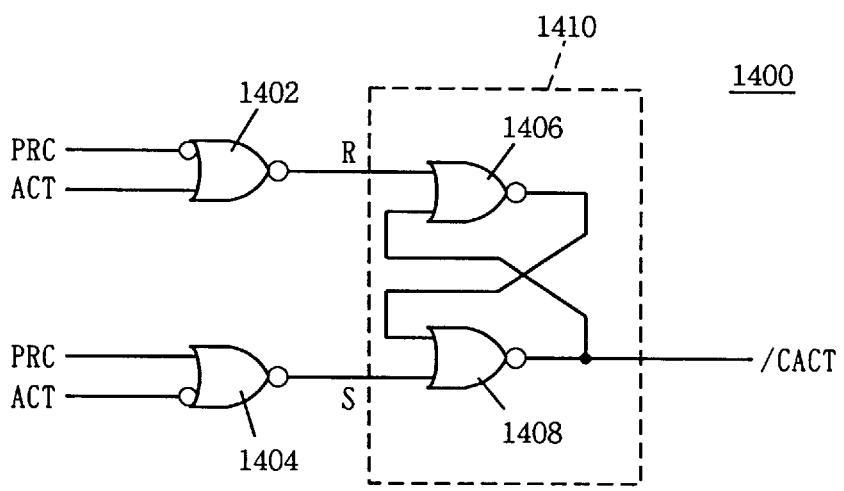
FIG. 8 is a block diagram schematically showing the configuration of a second circuit portion 1400 included in control circuit 100 in the SDRAM according to the second embodiment of the invention.

FIG. 7 is a block diagram schematically showing a first circuit portion 1300 in a first stage buffer control circuit which generates a control signal /CACT to control the operation of second input first stage buffer circuit 200, while FIG. 8 is a block diagram schematically showing the configuration of a second circuit portion 1400 included in the first stage buffer control circuit.

First circuit portion 1300 includes a 4-input NAND circuit 1302 which receives signal ext./RAS, signal /CAS which is the inverse of signal ext./CAS, signal ext./CS, and signal WE which is the inverse of signal ext./WE, a clocked inverter circuit 1304 which receives the output of NAND circuit 1302 and is controlled by signal int.CLK1 and its inverse int./CLK1 to output a signal ACT, a 4-input NAND circuit 1306 which receives signal ext./RAS, signal CAS, signal ext./CS and ext./WE, and a clocked inverter circuit 1308 which receives the output of NAND circuit 1306 and is controlled by signals int.CLK1 and int./CLK1 to output a signal PRC.

Referring to FIG. 8, second circuit portion 1400 includes an NOR circuit 1402 which receives the inverse of signal PRC and signal ACT, an NOR circuit 1404 which receives signal PRC and a determination signal for signal ACT, and an SR flip-flop circuit 1410 formed by cross-coupling NOR circuits 1406 and 1408.

Herein, the output of NOR circuit 1402 is input as a reset signal for SR flip-flop circuit 1410, and the output of NOR circuit is input as a set signal S for the SR flip-flop circuit. The inverted output of SR flip-flop circuit 1410 is output as signal /CACT.

Figure 9:
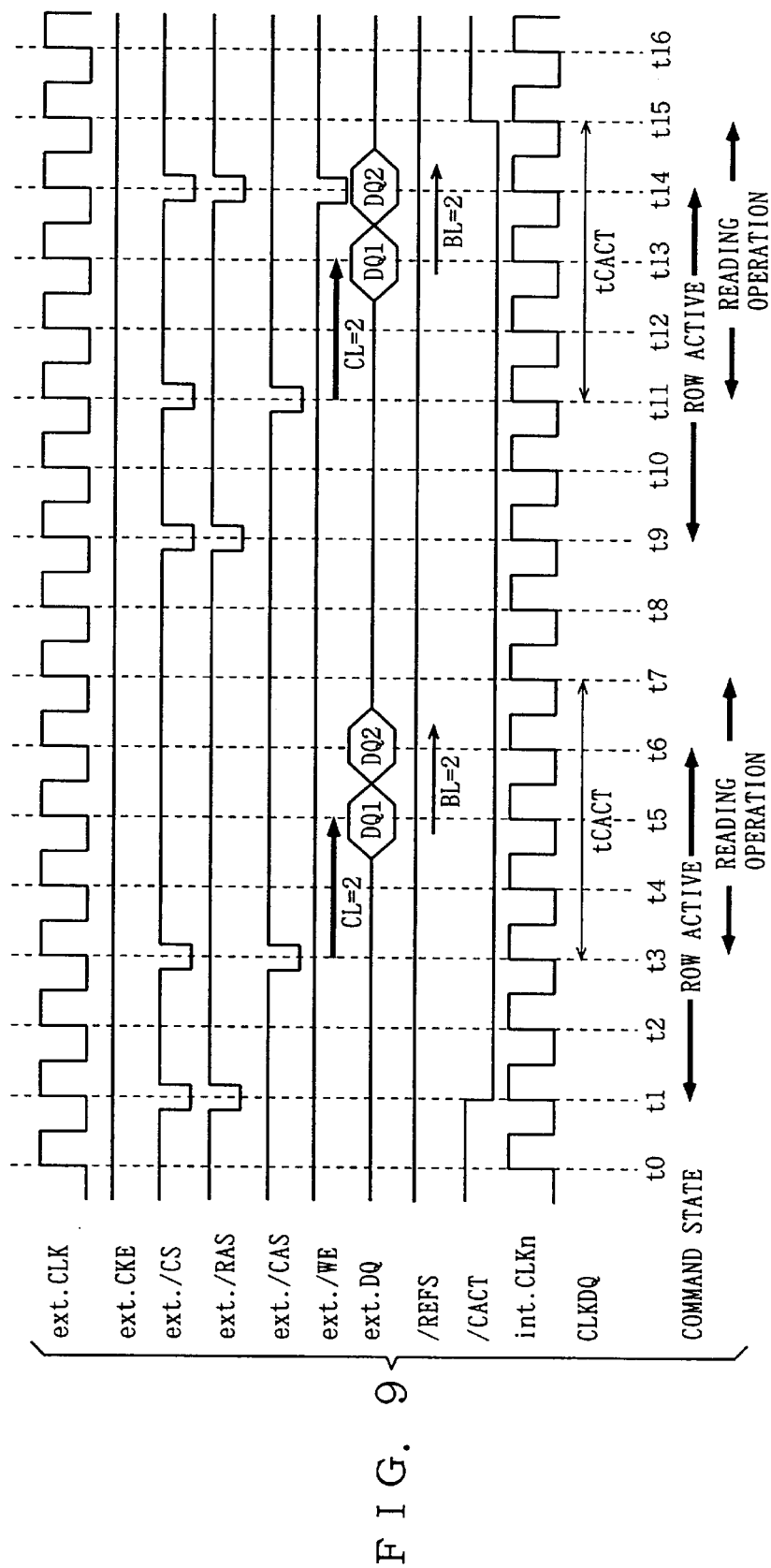
FIG. 9 is a timing chart for use in illustration of the operation of the SDRAM according to the second embodiment.

FIG. 9 is a timing chart for use in illustration of the operation of the SDRAM according to the second embodiment.

The operation of the second embodiment is the same as the operation of SDRAM 1000 according to the first embodiment shown in FIG. 4 in that at time t1 signals ext./CS and ext./RAS are activated to cause a row address signal to be incorporated, then at time t3 signals ext./CS and ext./CAS are activated to cause a column address signal to be incorporated, and then at time t5 data output is started.

However, at the point in which burst length BL is 2 and read data DQ2 of the second bit is output at time t6, signals ext./CS, ext./RAS and ext./WE are not activated and a precharge state is not specified. Subsequently, at time t13, data is once again read out, then at time 14 at which only the amount of data specified by the burst length is output, signals ext./CS, ext./RAS and ext./WE are activated to specify a precharging operation of the row related circuits.

More specifically, in the operation of the SDRAM according to the second embodiment shown in FIG. 9, during the period since the activation of the row related circuits is specified at time t1 followed by the specifying of the precharging operation at time t14 until the precharging operation of the row related circuits starts, if two or more reading operations are present, signal /CACT maintains its active state.

Meanwhile, in the SDRAM 1000 according to the first embodiment, each time the reading operation completes a precharging operation is initiated, and therefore in order to continuously perform a reading operation, an extra time period is necessary until the precharging operation completes.

More specifically, the SDRAM according to the second embodiment can operate at a higher speed if the reading mode is continuously specified.

Third Embodiment

Figure 10:
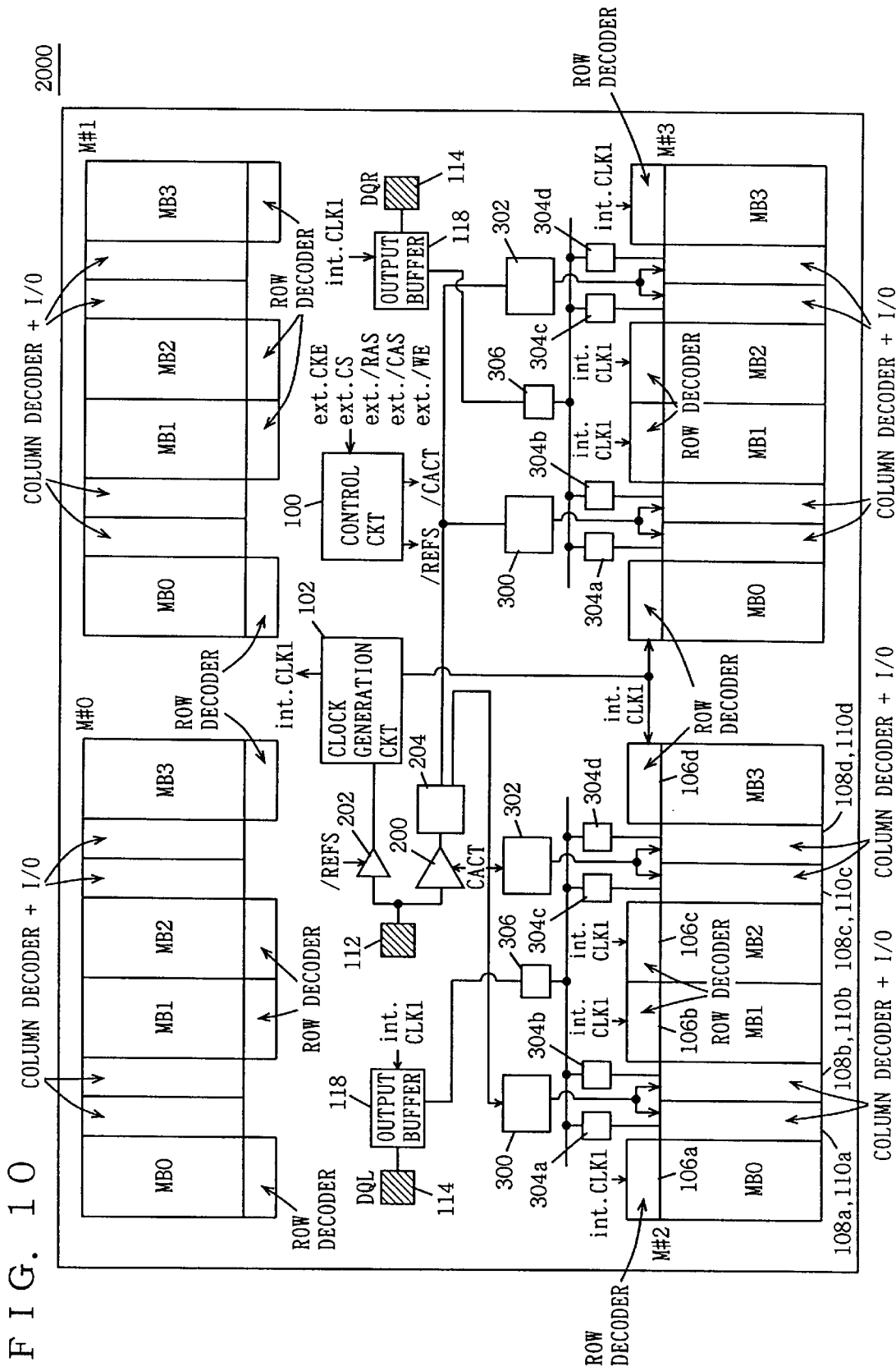
FIG. 10 is a block diagram schematically showing the configuration of an SDRAM 2000 according to a third embodiment of the invention.

FIG. 10 is a block diagram schematically showing the configuration of an SDRAM 2000 according to a third embodiment of the invention.

The third embodiment is different from SDRAM 1000 according to the first embodiment shown in FIG. 1 in the following points.

Firstly, each of memory cell planes M#0 to M#3 is divided into four memory cell blocks MB0 to MB3.

In addition, corresponding to memory cell blocks MB0 to MB3, row decoders 106a to 106d, column decoders 108a to 108d and input/output circuits 110a to 110d are provided.

Herein, in FIG. 10 a column decoder and an input/output circuit are represented as one block.

Furthermore, for the pair of memory cell blocks MB0 and MB1 and the pair of memory cell blocks MB2 and MB3, local clock generation circuits 300 and 302 are provided. An internal clock signal output from second clock generation circuit 204 is applied to local clock generation circuits 300 and 302 rather than to output buffer 118. Accordingly, local clock generation circuits 300 and 302 supply an internal clock signal to a corresponding memory cell block.

Data output from input/output circuit 110 has its value retained in bus driver circuits 304a to 304d provided corresponding to memory cell blocks. Read data output from any of bus driver circuits 304a to 304d corresponding to a selected memory cell is once again retained in an intermediate latch circuit 306 connected commonly to bus driver circuits 304a to 304d.

Intermediate buffer circuit 306 applies read data which it retains to output buffer 118.

Note that in FIG. 10, only the detailed configuration corresponding to memory planes M#2 and M#3 is shown, but the same configuration corresponds to memory planes M#0 and M#1.

In FIG. 10, data read out from memory cell planes M#2 and M#3 is applied to output buffer 118 for the ease of illustration, but the configuration is not essentially different from that shown in FIG. 1.

The same portions as SDRAM 1000 according to the first embodiment shown in FIG. 1 are denoted with the same reference characters and the description will not be repeated.

Figure 11:
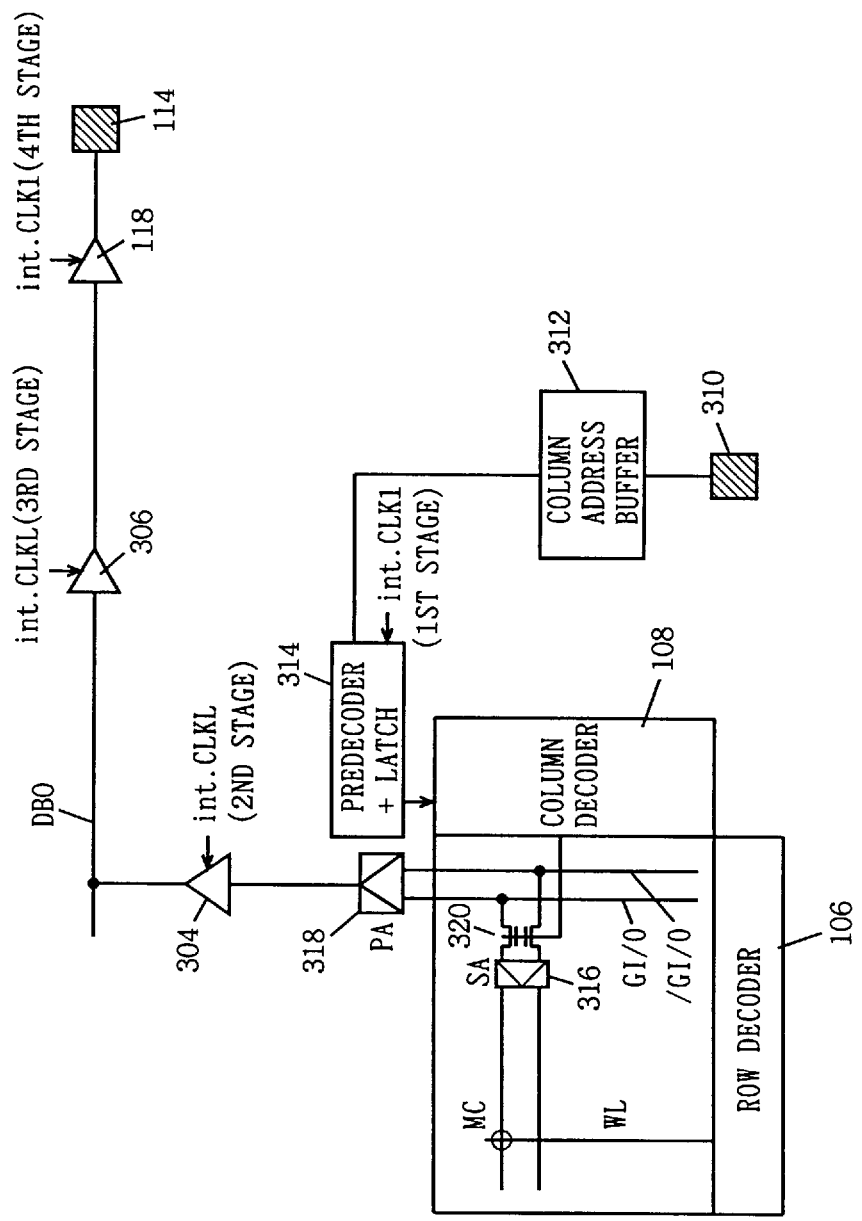
FIG. 11 is a partly enlarged diagram showing the configuration of column related circuitry in SDRAM 2000.

FIG. 11 is a diagram schematically showing how a signal travels from a memory cell block to the output buffer including the external address input pad and the column address buffer which are not shown in the configuration of SDRAM 2000 shown in FIG. 10.

Let us assume that a single word line WL has been selected in response to an externally applied row address signal in the following description.

A column address buffer 312 receives column address signal Yb applied to external address input pad 310 and outputs a column address signal to a predecoder 314.

Herein, predecoder 314 includes a latch circuit therein, and the column address signal output from column address buffer 312 causes a latching operation of data from address buffer 312 in response to an activation of internal clock signal int.CLK1 from first clock generation circuit 102 shown in FIG. 10.

Then, a corresponding column address signal is applied to a memory cell block selected in predecoder 314. Column decoder 108 selects a corresponding column accordingly.

More specifically, based on the storage data of a memory cell MC connected to the selected word line WL, a sense amplifier 316 amplifies the potential difference of a corresponding bit line pair BL and /BL. The potential level amplified by sense amplifier 316 is transferred to a local IO line pair (not shown) through a transfer gate 320 controlled by column decoder 108, and then transferred to a global IO line pair GI/O and /GI/O.

The storage data read out onto global IO line pair GI/O and /GI/O is amplified by a preamplifier 318 and transferred to bus driver 304. A latch circuit included in bus driver 304 is controlled by internal clock signal int.CLKL output from local clock generation circuit 300 or 302.

Then, in response to the output of a data bus driven by bus driver 320, intermediate buffer 306 retains the data by the latch circuit operating in response to internal clock signal int.CLKL and outputs the data.

Output buffer 118 receives the output from intermediate buffer 306, retains the data in response to internal clock signal int.CLK1 from the first clock generation circuit and drives the potential level of a corresponding data input/output pad 114 based on the read data.

More specifically, in the SDRAM 2000 according to the third embodiment, the latching operations of data read out from a memory cell block and amplified by a preamplifier in bus driver 304 and intermediate buffer 306 are controlled by internal clock signal int.CLKL from local clock generation circuit 300 or 302.

Figure 12:
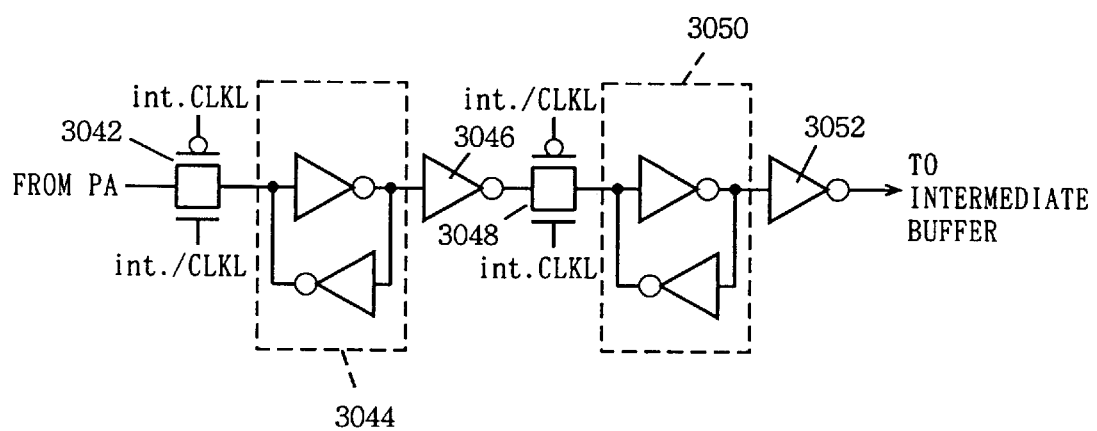
FIG. 12 is a circuit diagram showing the configuration of the buffer circuit shown in FIG. 11.

FIG. 12 is a block diagram showing the configuration of bus driver circuit 304, intermediate buffer 306, and output buffer circuit 118 shown in FIG. 11.

In the following, though the configuration of bus driver 304 will be described, the intermediate buffer or output buffer has the same basic configuration except that a different internal clock signal is used to control.

Bus driver 304 includes a transmission gate 3043 which conducts when clock signal CLKL is at an "L" level, a latch circuit 3044 which receives and retains the output of transmission gate 3042, an inverter 3046 which inverts an output received from latch circuit 3044, a transmission gate 3048 which receives the output of inverter 3046 and conducts when internal clock signal int.CLKL is at an "H" level, a latch circuit 3050 which receives the output of transmission gate 3048 and retains the output, and an inverter which outputs the inverse of an output received from latch circuit 3050.

More specifically, latch circuit 3050 and inverter 3052 constitute a driver circuit to drive the output side.

As can be clearly seen from FIG. 12, bus driver 304 incorporates data therein when internal clock signal int.CLKL is at an "L" level, and transfers the data to latch circuit 3050 to externally output the data at the point at which clock signal int.CLKL attains an "H" level.

Figure 13:
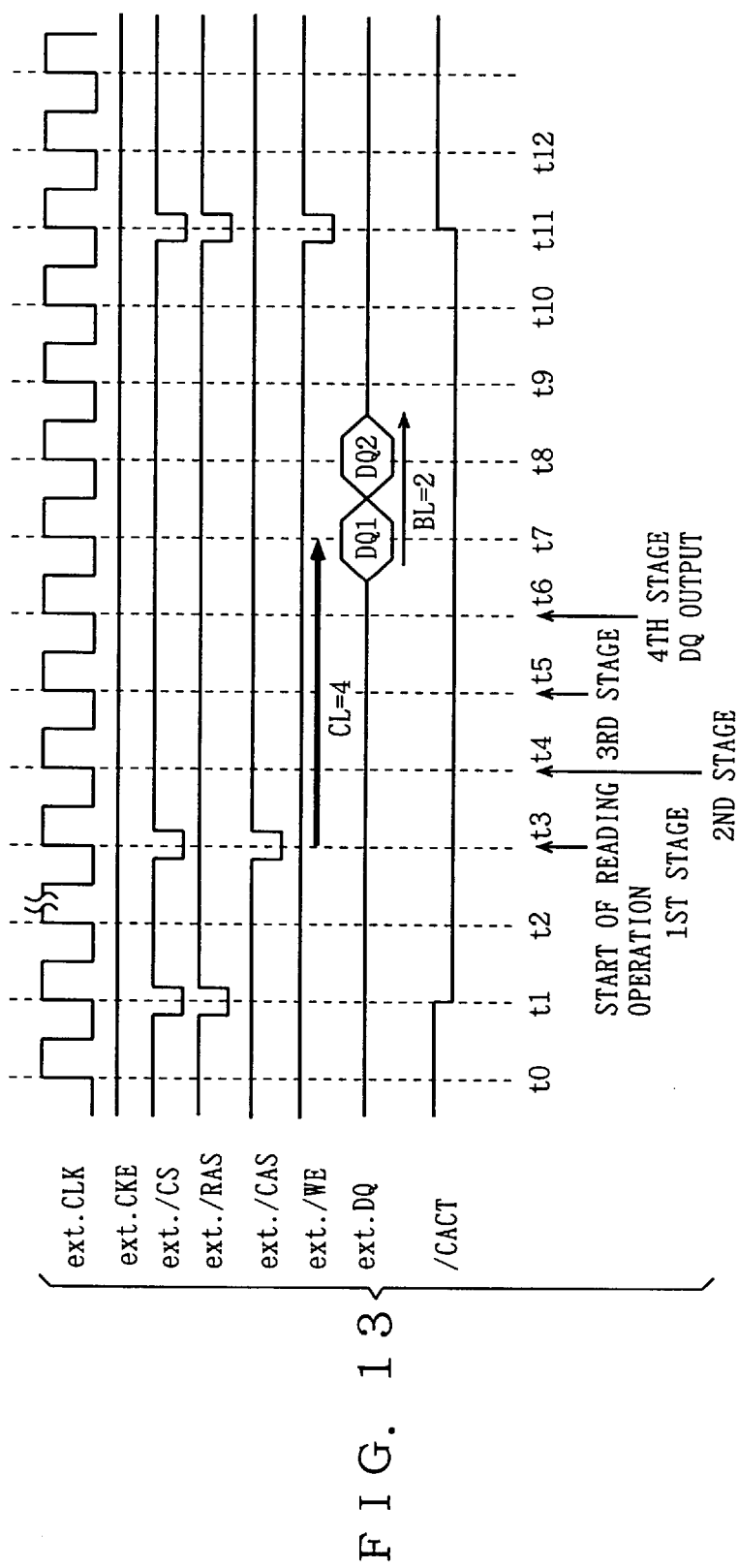
FIG. 13 is a timing chart for use in illustration of the operation of SDRAM 2000 according to the third embodiment.

FIG. 13 is a timing chart for use in illustration of the operation of SDRAM 2000 shown in FIGS. 10 and 11.

At time t1, signals ext./CS and ext./RAS are activated to cause a row address signal to be incorporated, at time t3 signals ext./CS and ext./CAS are activated to cause a column address signal to be incorporated as is the case with SDRAM 1000 according to the first embodiment.

Note that in this embodiment, at time t1 the row related circuits are activated, and signal /CACT to activate the operation of second input first stage buffer circuit 200 is brought to an active state ("L" level) accordingly.

Note however that signal /CACT may be activated only during the reading operation as shown in FIG. 4.

In the configuration shown in FIG. 13, CAS latency CL is set to 4.

Therefore, data starts to be output at time t7, four cycles after time t3.

Now, referring to FIG. 11, the operation during the period from time t3 at which signal ext./CAS is activated and column address signal Yb is incorporated until time t7 at which data starts to be output will be described in more detail.

At time t3 at which the column address signal is incorporated, in response to internal clock signal int.CLK1 from first clock generation circuit 102, the column address signal is latched and predecoded in predecoder 314.

In response to an internal column address output from predecoder 314, column decoder 108 selects a corresponding column, read data is transferred to global IO line pair GI/O and /GI/O, and preamplifier 318 amplifies the data.

At time t4, the read data amplified by preamplifier 318 is latched in bus driver 304 controlled by internal clock signal int.CLKL, and corresponding data is output to a data bus DBO.

Thereafter, at time t5, the read data on the data bus is latched in intermediate buffer 306 in synchronization with internal clock signal int.CLKL, and output to output buffer 118.

At time t6, output buffer 118 latches the data from intermediate buffer 306 in response to internal clock signal int.CLK1 from the first clock generation circuit, and outputs the data to data input/output pad 114.

In the SDRAM 1000 according to the third embodiment, the data latching operation in the pipeline operation of the SDRAM after the amplifying by the preamplifier until the data is transferred to the output buffer circuit is controlled by internal clock signal int.CLKL output from local clock generation circuit 300 or 302.

In SDRAM 1000 according to the first embodiment, an external clock signal is buffered by first input first stage buffer circuit 202, then the series of operations are controlled in synchronization with internal clock signal int.CLK1 generated by first clock generation circuit 102. Therefore, in order to perform these operations at a higher speed, the driving capabilities of the first input first stage buffer circuit and first clock generation circuit 102 must be increased, in other words the size of the transistor constituting each of these circuits should be increased or the number of stages of inverters constituting the buffer should be increased.

Meanwhile, in SDRAM 2000 according to the second embodiment, the operations of the second stage (the cycle in which the bus driver latches the read data from preamplifier 318) and the third stage (the cycle in which intermediate buffer 306 retains the read data from bus driver 304) shown in FIG. 13 are controlled by internal clock signal int.CLKL output from independent local clock generation circuit 300 or 302, and therefore if the length of interconnection from the central part of the chip to the local clock generation circuit increases as the memory capacity increases, and if the interconnection becomes the critical path for the reading operation which determines the time constant of a signal passed therethrough, high speed operations with reduced current consumption is permitted by reducing the number of stages of driving circuits to drive the potential of the interconnection and restricting the generation of skews of internal clock signals.

Figure 14:
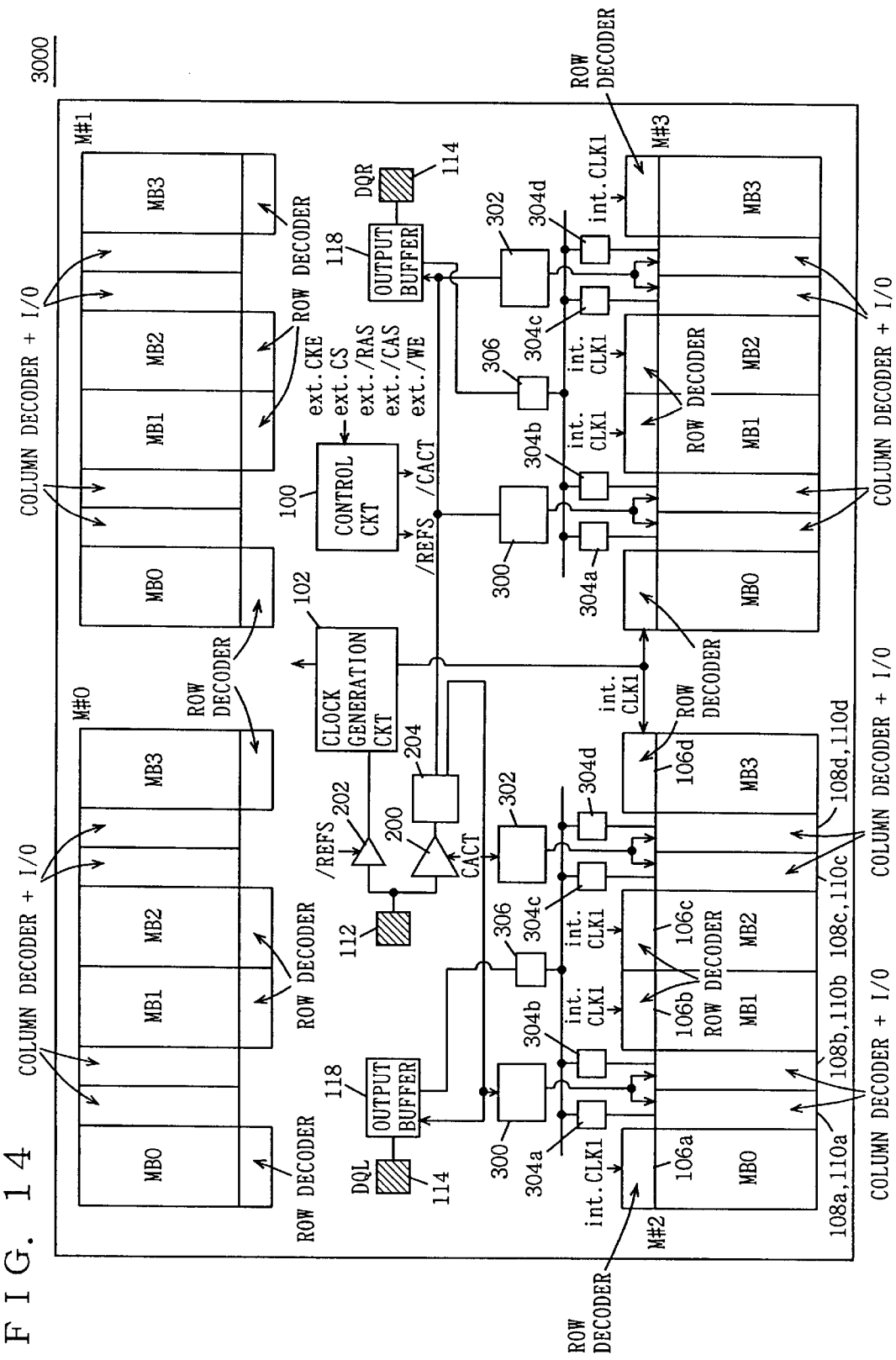
FIG. 14 is a block diagram schematically showing the configuration of an SDRAM 3000, a variation of SDRAM 2000 according to the third embodiment.

FIG. 14 is a block diagram schematically showing the configuration of a variation of SDRAM 2000 according to the third embodiment, SDRAM 3000.

The variation is different from the configuration of SDRAM 2000 according to the third embodiment shown in FIG. 10 in that output buffer circuit 118 is controlled by internal clock signal int.CLK2 from second clock generation circuit 204.

Otherwise, the variation is the same as SDRAM 2000 according to the third embodiment shown in FIG. 10, and therefore the same portions are denoted with the same reference characters and the description will not be repeated.

In the SDRAM 3000 according to the third embodiment, output buffer 118 is controlled by internal clock signal int.CLK2 output from second clock generation circuit 204, and therefore time delay required for the transfer of an internal clock signal generated based on an external clock signal can be reduced, so that the operable clock rate can be increased even if the output circuit is positioned at the end of the chip apart from the center of the chip as have been described in conjunction with the first embodiment.

Furthermore, even in such a configuration, input first stage buffer circuit 200 which transfers an external clock signal to second clock generation circuit 204 is controlled by signal /CACT, and operates only during the data reading mode period or active period of SDRAM 3000, current consumption in the stand-by state can be restricted from increasing even if the size of transistors involved therein is increased in order to enable high speed accessing.

Fourth Embodiment

The basic configuration of an SDRAM according to a fourth embodiment of the invention is substantially identical to that of SDRAM 1000 shown in FIG. 1 with the following differences.

More specifically, in the SDRAM according to the fourth embodiment, the width of interconnection 206 or 208 to transfer internal clock signal int.CLK2 from second clock generation circuit 204 to output buffer circuit 118 or the distance between adjacent interconnections is more suitable for high speed operation in the configuration of the SDRAM according to the first embodiment.

Figure 15:
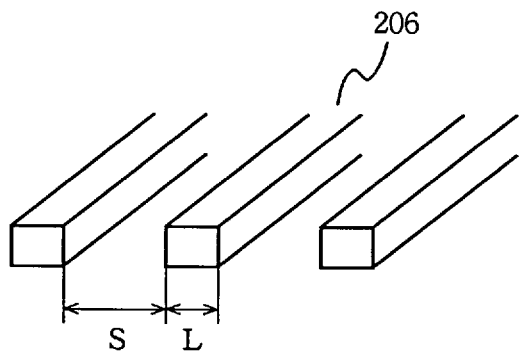
FIG. 15 is a view schematically showing interconnections to transfer a clock signal.

FIG. 15 is a view showing the relation between interconnection 206 or 208 and other adjacent interconnection.

Herein, the interconnection width is L and the distance between interconnections is S.

Figure 16:
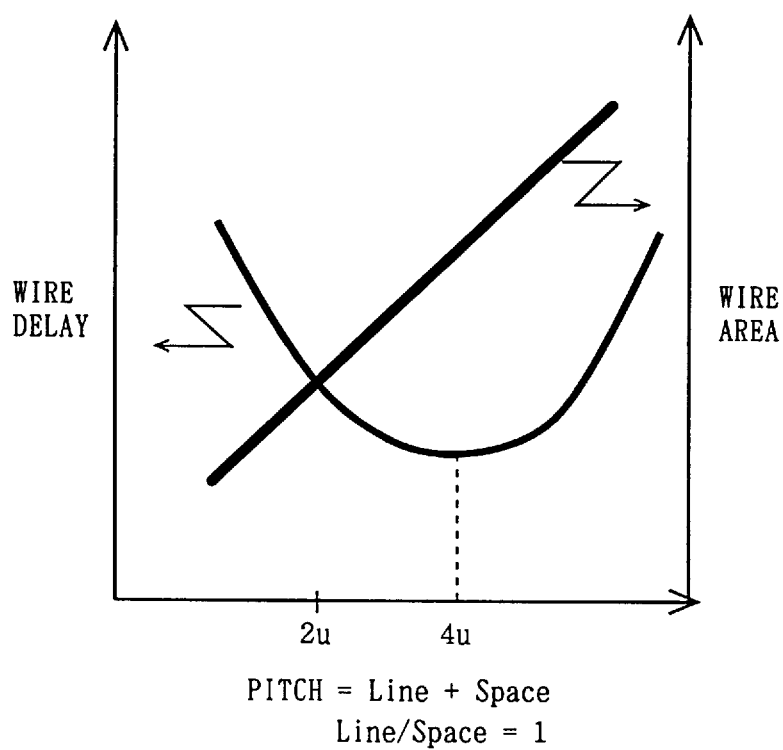
FIG. 16 is a graph showing the relation between interconnection pitch, interconnection delay and interconnection area.
Figure 17:
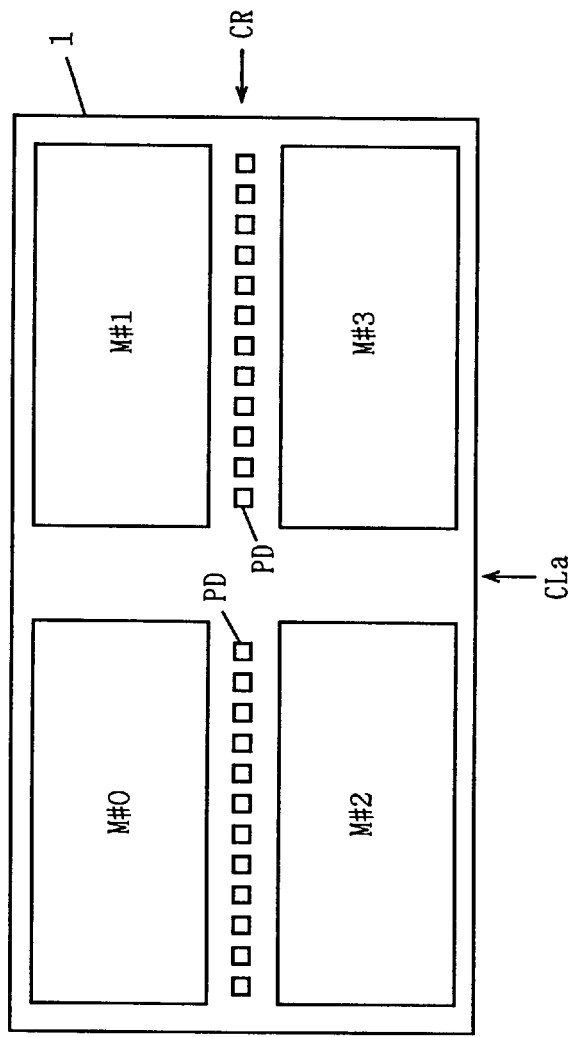
FIG. 17 is a diagram schematically showing an example of the arrangement of pads in a conventional SDRAM.
Figure 18:
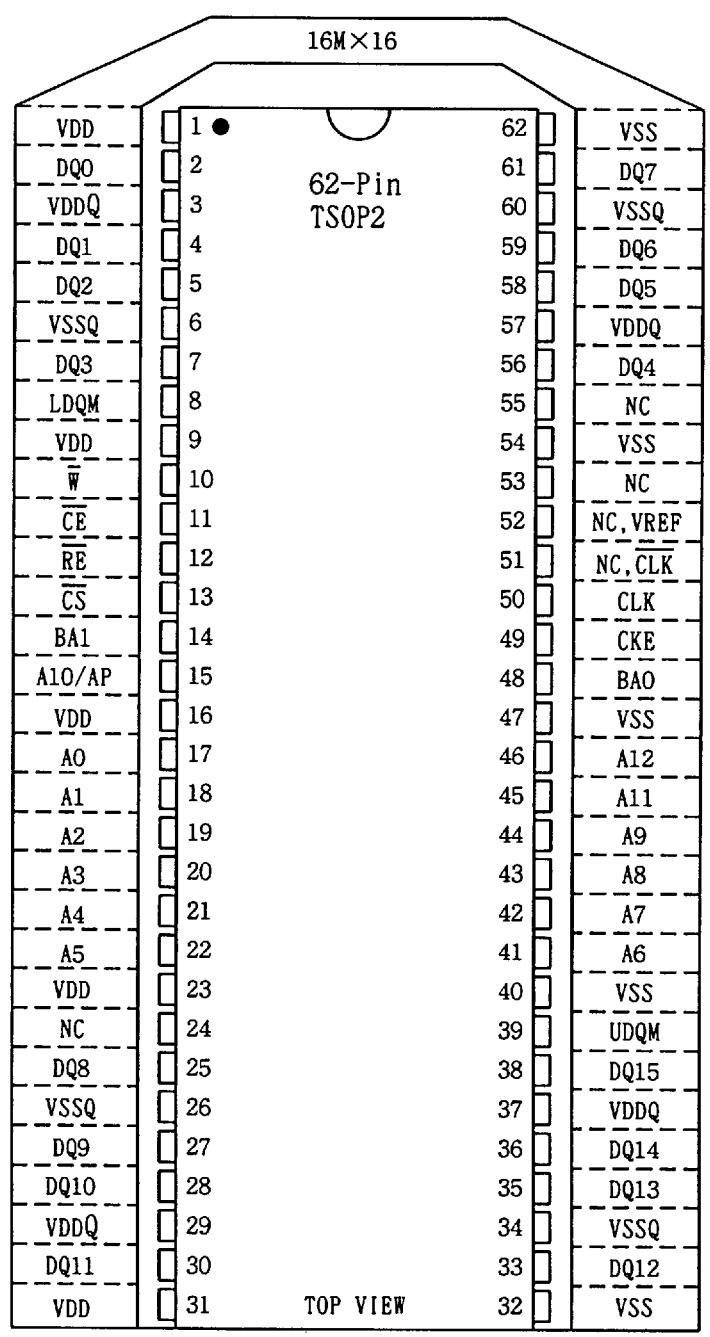
FIG. 18 is a diagram for use in illustration of a pin arrangement in a conventional SDRAM.
Figure 19:
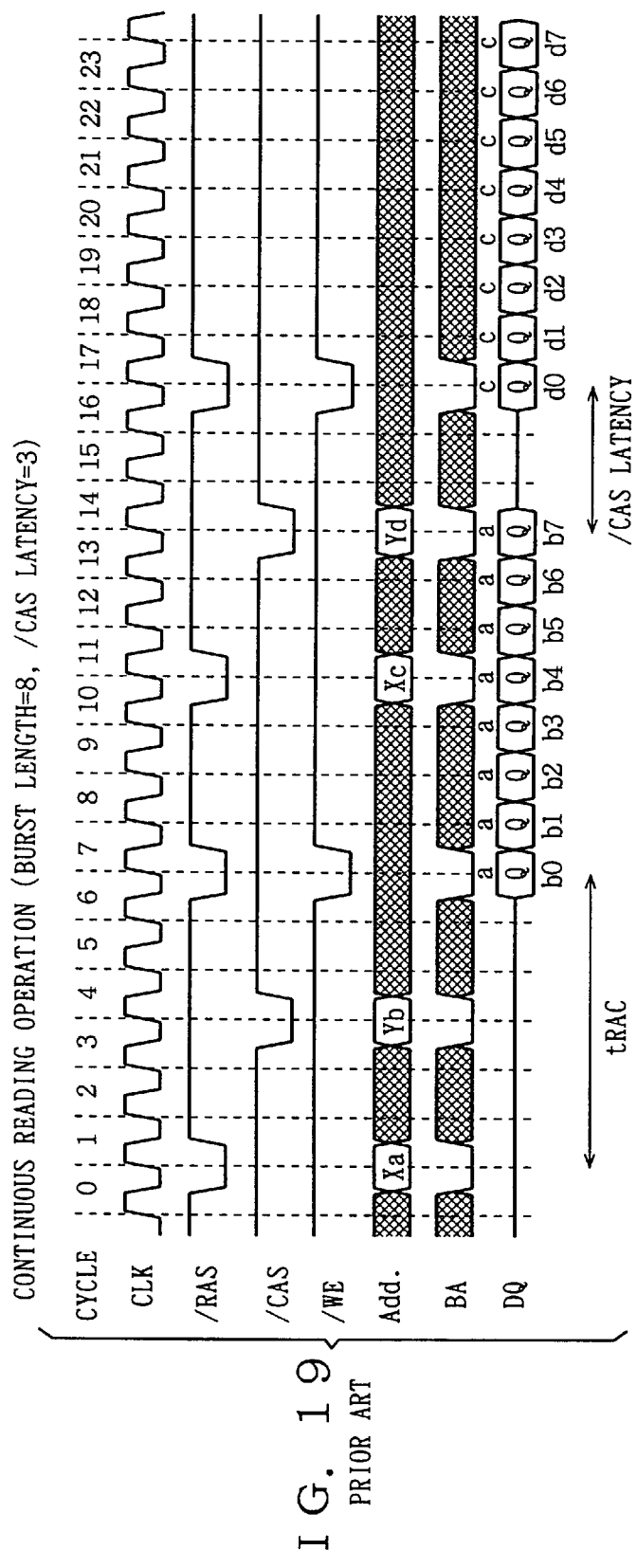
FIG. 19 is a timing chart for use in illustration of the reading operation of a conventional SDRAM.
Figure 20:
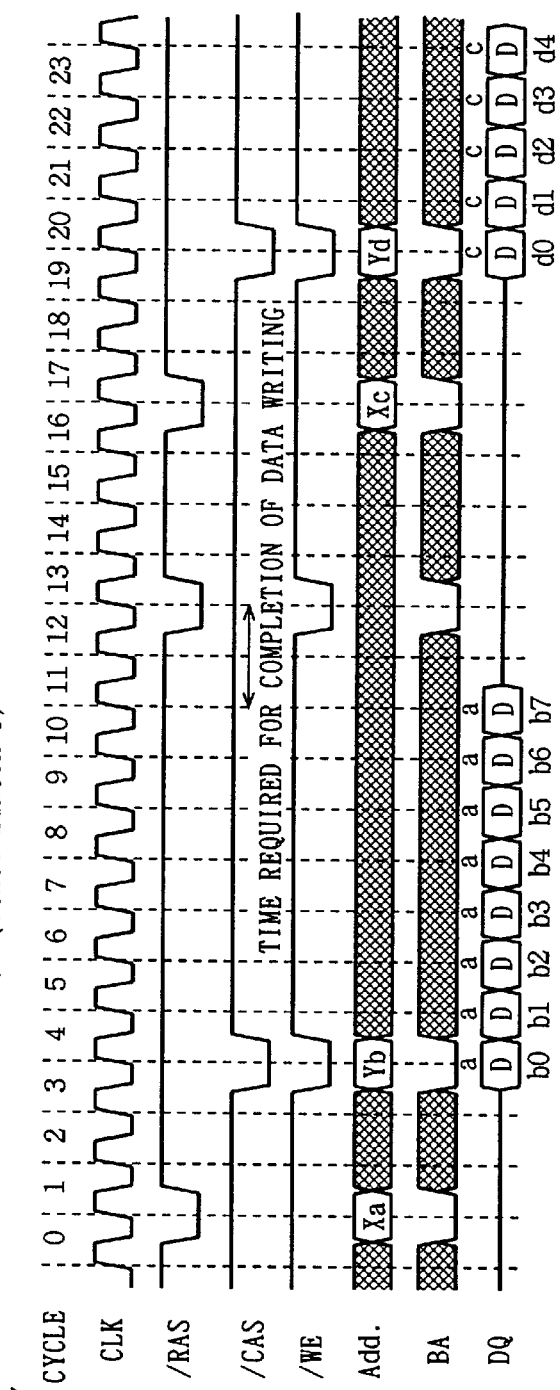
FIG. 20 is a timing chart for use in illustration of the writing operation of a conventional SDRAM.

FIG. 16 is a graph showing the relation of interconnection delay time and interconnection area relative to interconnection pitch, in other words relative to the sum of interconnection width L and inter-interconnection distance S.

Herein, the ratio of interconnection width L and inter-interconnection distance S is fixed to 1.

If the ratio of the inter-interconnection distance to the interconnection width is retained at a fixed value, the interconnection delay initially decreases as the pitch increases. This is because the interconnection resistance decreases as the interconnection width increases.

However, if the interconnection pitch exceeds 4 µm, the interconnection delay increases conversely. This is because as the interconnection width increases, the earth capacitance increases, and the interconnection delay increases accordingly.

More specifically, the interconnection delay has an optimum value for fixed interconnection width and inter-interconnection distance.

However, it is not reasonable to determine the interconnection width simply based on the amount of interconnection delay in view of the interconnection area.

In other words, as the interconnection pitch increases, the interconnection area uniformly increases, such a simple optimum point for the interconnection delay is not always the optimum point when the chip area is accounted for.

In order to determine the interconnection delay taking into account the chip area, the point defined by L/S=1 $\mu$m/1 $\mu$m is about optimum.

Most signal lines within the chip are therefore laid out at this pitch. The interconnection which transfers a clock signal should be suitable for high speed operation, and therefore L/S=2 $\mu$/2 $\mu$ should be optimum as shown in FIG. 16 if the interconnection pitch is set to an optimum point. If the ratio of L/S is 1, L/S=2 $\mu$/2 $\mu$ is about optimum, while for L/S<1, the interconnection delay can be even smaller.

The optimum points for interconnection width L and inter-interconnection distance S vary based on the thickness of interconnection, the dielectric constant of an insulating film around the interconnection.

Therefore, interconnection width L or inter-interconnection distance S for clock interconnections should be larger than the interconnection width or inter-interconnection distance of interconnections used therearound, and should be at least 1.5 times as large as the surrounding interconnection.

At such values, the interconnection delay of the clock signal interconnections which should permit operation at higher speed than other signal interconnections can be optimized in view of the entire chip.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A rectangular synchronous dynamic semiconductor memory device receiving a plurality of external signals including a control signal and an address signal in synchronization with an external clock signal of a series of pulse strings and outputting storage data, comprising:

a memory cell array having a plurality of memory cells arranged in rows and columns;

first clock generation means receiving said external clock signal for outputting a first internal clock signal;

control means responsive to said first internal clock signal and said external signals for controlling the data outputting operation of said synchronous dynamic semiconductor memory device;

a plurality of input/output terminals provided along the direction of a first side of said rectangle for receiving said plurality of external signals or outputting said storage data, said plurality of input/output terminals including an external clock input terminal to receive said external clock signal, and first and second data input/output terminals provided having said external clock input terminal and said control means therebetween, said synchronous dynamic semiconductor memory device, further comprising:

row selecting means controlled by said control means for selecting a corresponding row in said memory cell array in synchronization with said first internal clock signal from said first clock generation means and in response to an externally applied row address signal;

column selecting means controlled by said control means for selecting a plurality of corresponding columns in said memory cell array in synchronization with said first internal clock signal from said first clock generation means and in response to a column address signal and reading out the storage data of the plurality of memory cells corresponding to said selected row and columns;

second clock generation means receiving said external clock signal from said external clock input terminal for outputting a second internal clock signal; and first and second data outputting means receiving corresponding said storage data from said column selecting means for outputting said storage data to corresponding said first and second data input/output terminals respectively in response to said second internal clock signal directly received from said second clock generation means.

2. The synchronous dynamic semiconductor memory device as recited in claim 1, further comprising first clock input buffer means provided corresponding to said external clock input terminal for buffering said external clock signal for transfer to said first clock generation means; and second clock input buffer means provided corresponding to said external clock input terminal for buffering said external clock signal for transfer to said second clock generation means and having current driving capability larger than said first clock input buffer means.

3. The synchronous dynamic semiconductor memory device as recited in claim 1, further comprising:

first clock input buffer means provided corresponding to said external clock input terminal for buffering said external clock signal for transfer to said first clock generation means; and second clock input buffer means provided within shorter distance from said second clock generation means than that between said control means and said second clock generation means for buffering said external clock signal applied on said external clock input terminal for transfer to said second clock generation means.

4. The synchronous dynamic semiconductor memory device as recited in claim 3, wherein said control means brings said second clock input buffer means into an active state during the period in which a data reading mode is specified in response to said external signal.

5. The synchronous dynamic semiconductor memory device as recited in claim 3, wherein said control means brings said first clock input buffer means into an inactive state during the period in which a self refresh mode is specified in response to said external signal.

6. The synchronous dynamic semiconductor memory device as recited in claim 3, further comprising:

a first interconnection arranged extending from said second clock generation means to said second data outputting means for transferring said second internal clock signal from said second clock generation means to said second data output means;

a second interconnection provided extending from said second clock generation means to said first data outputting means for transferring said second internal clock signal from said second clock generation means to said first data output means; and a third interconnection provided extending from said external clock input terminal to said first clock generation means for transferring said external clock signal to said first clock generation means, the widths of said first and second interconnections are each 1.5 times or more the width of said third interconnection.

7. The synchronous dynamic semiconductor memory device as recited in claim 3, further comprising:
   a first interconnection provided extending from said second clock generation means to said second data outputting means for transferring said second internal clock signal from said second clock generation means to said second data outputting means;
   a second interconnection provided extending from said second clock generation means to said first data outputting means for transferring said second internal clock signal from said second clock generation means to said first data outputting means;
   a third interconnection provided extending from said external clock input terminal to said first clock generation means for transferring said external clock signal to said first clock generation means; and
   a fourth interconnection connecting said control means, said row selecting means and said column selecting means,
   both a first distance between said first interconnection and adjacent said fourth interconnection and a second distance between said second interconnection and adjacent said fourth interconnection are 1.5 times or more the distance between said third interconnection and adjacent said fourth interconnection.

8. The synchronous dynamic semiconductor memory device as recited in claim 3, wherein
   said second clock input buffer means and said second clock generation means are provided nearer to the side of said second data input/output terminal than said control means,
   said synchronous dynamic semiconductor memory device further comprising:
   a first interconnection provided extending from said second clock generation means to said second data outputting means along the direction of said first side for transferring said second internal clock signal from said second clock generation means to said second data outputting means; and
   a second interconnection provided in the same direction as said first interconnection along said first side direction in a first prescribed length, then folded and extending in the opposite direction to said first interconnection along said first side direction in a second prescribed length for transferring said second internal clock signal from said second clock generation means to said first data outputting means.

9. The synchronous dynamic semiconductor memory device as recited in claim 3, further comprising a plurality of preamplifying means receiving and amplifying storage data from the plurality of memory cells selected by said column selecting means;
   a plurality of latch means provided corresponding to said preamplifying means for retaining the output of a corresponding preamplifying means at a specified time point; and
   a plurality of local control means receiving said second internal clock signal from said second clock generation means for controlling timing for retaining data of said latch means.

10. A rectangular synchronous dynamic semiconductor memory device receiving a plurality of external signals including a control signal and an address signal in synchronization with an external clock signal of a series of pulse strings and outputting storage data, comprising:
   an even number of memory cell planes each provided to leave a margin region having a prescribed width along at least one of the central axis of said rectangle in the direction of a longer side and the central axis in the direction of a shorter side and each having a plurality of memory cells arranged in rows and columns,
   said synchronous dynamic semiconductor memory device including, in said marging region, first clock generation means receiving said external clock signal for outputting a first internal clock signal,
   control means responsive to said first internal clock signal and said external signals for controlling the data outputting operation of said synchronous dynamic semiconductor memory device, and
   a plurality of input/output terminals receiving said plurality of external signals or outputting said storage data and provided along the direction of the central axis of said margin region,
   said plurality of input/output terminals having an external clock input terminal to receive said external clock signal, and first and second data input/output terminals positioned with said external clock input terminal and said control means therebetween,
   said synchronous dynamic semiconductor memory device further including in said margin region,
   row selecting means controlled by said control means for selecting a corresponding row in said memory cell plane in synchronization with said first internal clock signal from said first clock generation means and in response to an externally applied row address signal;
   column selecting means controlled by said control means for selecting a plurality of corresponding columns in said memory cell plane in synchronization with said first internal clock signal from said first clock generation means and in response to a column address signal and reading out the storage data of the plurality of memory cells corresponding to said selected row and columns;
   second clock generation means receiving said external clock signal from said external clock input terminal for outputting a second internal clock signal; and
   first and second data outputting means receiving corresponding said storage data from said column selecting means for outputting said storage data to corresponding said first and second data input/output terminals respectively in synchronization with said second internal clock signal directly received from said second clock generation means.

11. The synchronous dynamic semiconductor memory device as recited in claim 10, further comprising first clock input buffer means provided corresponding to said external clock input terminal for buffering said external clock signal for transfer to said first clock generation means; and
   second clock input buffer means provided corresponding to said external clock input terminal for buffering said external clock signal for transfer to said second clock generation means and having current driving capability larger than said first clock input buffer means.

12. The synchronous dynamic semiconductor memory device as recited in claim 10, further comprising first clock input buffer means provided corresponding to said external clock input terminal for buffering said external clock signal for transfer to said first clock generation means; and second clock input buffer means provided within a shorter distance from said second clock generation means than that between said control means and said second clock generation means for buffering said external clock signal applied on said external clock input terminal for transfer to said second clock generation means.

13. The synchronous dynamic semiconductor memory device as recited in claim 12, wherein said control means brings said second clock input buffer means into an active state during the period in which a data reading mode is specified in response to said external signal.

14. The synchronous dynamic semiconductor memory device as recited in claim 12, wherein said control means brings said first clock input buffer means into an inactive state during the period in which a self refresh mode is specified in response to said external signal.

15. The synchronous dynamic semiconductor memory device as recited in claim 12, further comprising a first interconnection provided extending from said second clock generation means to said second data outputting means for transferring said second internal clock signal from said second clock generation means to said second data outputting means;

a second interconnection provided extending from said second clock generation means to said first data outputting means for transferring said second internal clock signal from said second clock generation means to said first data outputting means; and a third interconnection provided extending from said external clock input terminal to said first clock generation means for transferring said external clock signal to said first clock generation mean, the widths of said first and second interconnections are each 1.5 times or more the width of said third interconnection.

16. The synchronous dynamic semiconductor memory device as recited in claim 12, further comprising:

a first interconnection provided extending from said second clock generation means to said second data outputting means for transferring said second internal clock signal from said second clock generation means to said second data outputting means;

a second interconnection provided extending from said second clock generation means to said first data outputting means for transferring said second internal clock signal from said second clock generation means to said first data outputting means;

a third interconnection provided extending from said external clock input terminal to said first clock generation means for transferring said external clock signal to said first clock generation means; and a fourth interconnection connecting said control means, said row selecting means and said column selecting means, both a first distance between said first interconnection and adjacent said fourth interconnection and a second distance between said second interconnection and adjacent said fourth interconnection are 1.5 times or more the distance between said third interconnection and adjacent said fourth interconnection.

17. The synchronous dynamic semiconductor memory device as recited in claim 12, wherein said second clock input buffer means and said second clock generation means are provided nearer to the side of said second data input/output terminal than said control means, said synchronous dynamic semiconductor memory device further comprising a first interconnection provided extending from said second clock generation means to said second data outputting means along the direction of the central axis along which said margin region is provided, and a second interconnection provided extending in the same direction as said first interconnection along the direction of the central axis along which said margin region is provided in a first prescribed length, then folded and extending in the opposite direction to said first interconnection along the central axis along which said margin region is provided in a second prescribed length for transferring said second internal clock signal from said second clock generation means to said first data outputting means.

18. The synchronous dynamic semiconductor memory device as recited in claim 12, further comprising:

a plurality of preamplifying means receiving and amplifying the storage data of the plurality of memory cells selected by said column selecting means;

a plurality of latch means provided corresponding to said preamplifying means for retaining the output of corresponding preamplifying means at a specified time point; and a plurality of local control means receiving said second internal clock signal from said second clock generation means for controlling timing for retaining data by said latch means.

\* \* \* \* \*